(12) United States Patent
Kwon et al.

(10) Patent No.: US 11,779,940 B1
(45) Date of Patent: Oct. 10, 2023

(54) SYSTEMS, METHODS AND APPARATUS FOR DISPENSING FLUID TO AN OBJECT

(71) Applicant: Sonix, Inc, Springfield, VA (US)

(72) Inventors: Young-Shin Kwon, Chantilly, VA (US); Paul Ivan John Keeton, Woodbridge, VA (US); James C. McKeon, Woodbridge, VA (US)

(73) Assignee: Sonix, Inc., Springfield, VA (US)

( * ) Notice: Subject to any disclaimer, the term of this patent is extended or adjusted under 35 U.S.C. 154(b) by 162 days.

(21) Appl. No.: 17/084,576

(22) Filed: Oct. 29, 2020

(51) Int. Cl.
*B05B 1/26* (2006.01)
*H01L 21/67* (2006.01)
*B05B 1/18* (2006.01)
*G01N 29/28* (2006.01)

(52) U.S. Cl.
CPC .............. *B05B 1/26* (2013.01); *B05B 1/18* (2013.01); *G01N 29/28* (2013.01); *H01L 21/67288* (2013.01)

(58) Field of Classification Search
CPC ....... E03C 1/0408; B05B 1/1672; B05B 1/18; B05B 1/1636
See application file for complete search history.

(56) References Cited

U.S. PATENT DOCUMENTS

| 3,720,273 | A | 3/1973 | McKenry et al. |
| 4,393,991 | A * | 7/1983 | Jeffras ................ B05B 17/0607 |
| | | | 239/590.5 |
| 9,377,443 | B2 | 6/2016 | Kessler et al. |
| 10,926,284 | B1 * | 2/2021 | Khaled ................... B05B 17/08 |
| 2007/0246577 | A1 * | 10/2007 | Leber ....................... B05B 1/18 |
| | | | 239/548 |
| 2020/0086336 | A1 * | 3/2020 | Rosko ...................... B05B 1/26 |

FOREIGN PATENT DOCUMENTS

DE WO2013/139811 A1 * 9/2013
FR WO2019/106319 A1 * 6/2019

* cited by examiner

*Primary Examiner* — Qingzhang Zhou
(74) *Attorney, Agent, or Firm* — Leveque Intellectual Property Law, P.C.; Andrew J. Harrington

(57) ABSTRACT

Systems, methods and apparatus related to pre-wetting an edge portion of a bonded wafer prior to wetting a flat, horizontal portion of the bonded wafer. The apparatus includes a frame having nozzles directed such that couplant discharged from these nozzles wet the edge of the wafer. The edge nozzles have couplant flow vectors that interface to dampen the trajectory of fluid to reduce splash and pre-wet the edges of the bonded wafer.

10 Claims, 16 Drawing Sheets

SYSTEMS, METHODS AND APPARATUS FOR DISPENSING FLUID TO AN OBJECT

BACKGROUND

The present disclosure relates to providing couplant to an object, such as a bonded wafer.

A scanning process using an ultrasonic transducer benefits from using a fluid, or couplant to provide an imaging medium for the scanning process. Typically, edges of a wafer may not absorb, or be exposed to the fluid, or couplant, which causes artifacts and poor scanning.

There remains a need in ultrasonic scanning for uniform wetting of the wafer to enhance the results of inspection.

BRIEF DESCRIPTION OF THE DRAWINGS

The accompanying drawings, which are incorporated in and constitute a part of this specification, illustrate embodiments of the present disclosure and, together with a general description given above, and the detailed description given below, serve to explain the principles of the present disclosure.

Figure 1:
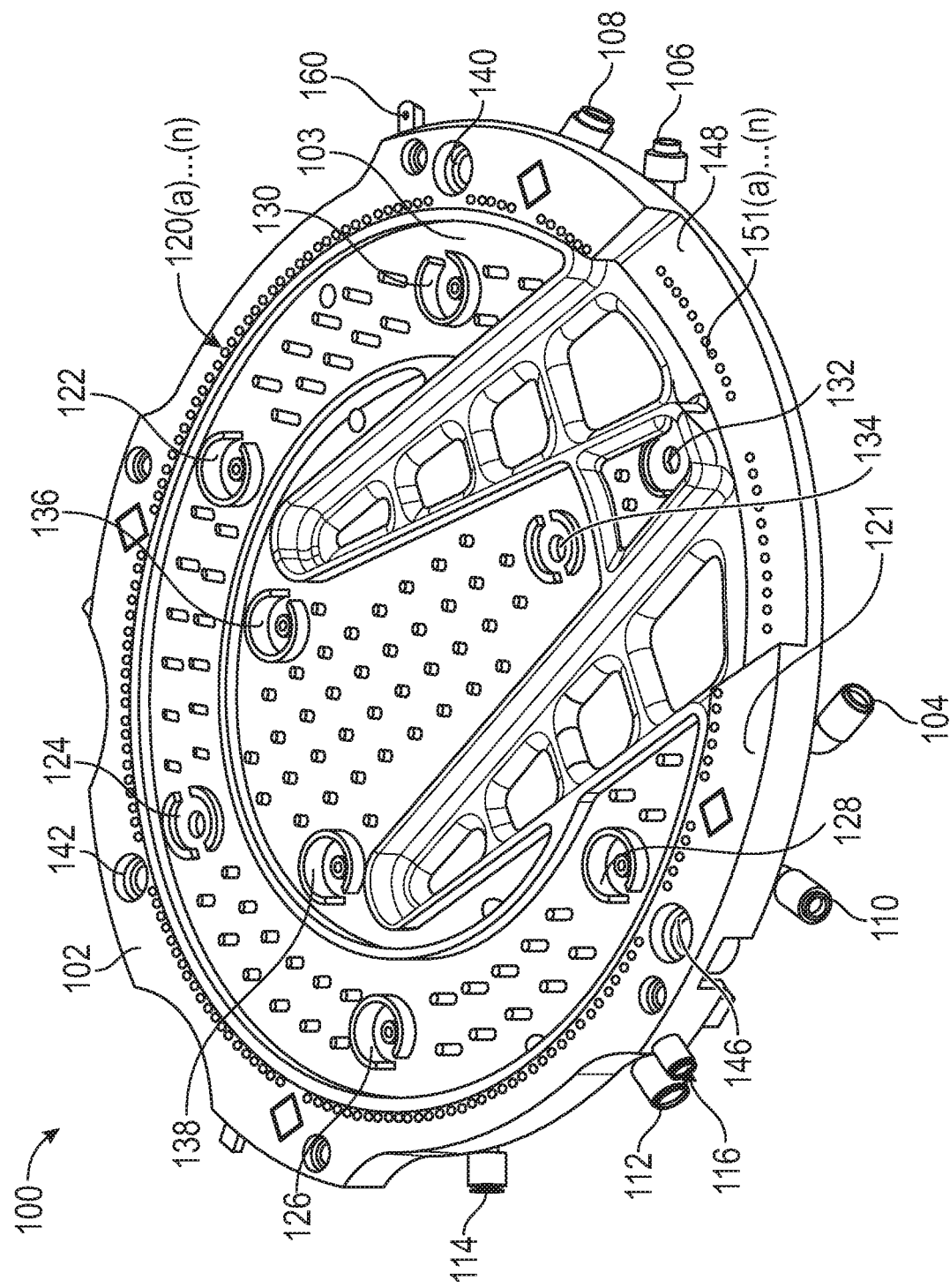
FIG. 1 shows a top view of a structure according to an embodiment of the disclosure.

It should be understood that the appended drawings are not necessarily to scale, presenting a somewhat simplified representation of various features illustrative of the basic principles of the disclosure. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION

The present disclosure will now be described more fully hereinafter with reference to the accompanying drawings, in which preferred embodiments are shown. This disclosure may, however, be embodied in many different forms and should not be construed as limited to the embodiments set forth herein. Rather, these embodiments are provided so that this disclosure will be thorough and complete, and will fully convey the scope to those skilled in the art.

Scanning Acoustic Microscopes (SAMs) can be used to nondestructively inspect bonded wafer pairs in the semiconductor industry for defects, particularly air type defects in the interior of the sample typically at internal interfaces. Ultrasonic inspection at frequencies that exceed 1 MHz can utilize a couplant, such as water, or other suitable fluid, for the ultrasound to propagate from the ultrasonic transducer to the sample and back again. A couplant can be a material (usually liquid) that facilitates the transmission of ultrasonic energy from the transducer into the test specimen. Water is a desired couplant since it is a low attenuative couplant and is readily available in semiconductor facilities either as De-ionized (DI) water or as Reverse Osmosis (RO) water or both.

Before being ultrasonically inspected, the bonded wafer pair is placed onto a wafer chuck to secure it during scanning. These chucks can be made of materials such as ceramic, stainless steel, or anodized aluminum for example, and often incorporate a form of vacuum to hold the wafer in place. Bonded wafer pairs typically only come in five to six standard sizes, namely 2", 4", 5", 6", 8", and 12" with 6", 8" and 12" being the most common. Therefore, the wafer chucks typically have different vacuum rings for the different sizes. For example, one chuck might support 4" to 8" wafer sizes, while a different chuck might support 8" and 12" wafer sizes. In addition, the wafer chucks may be modified to secure warped wafers.

Next, a couplant, fluid such as water, is introduced between the ultrasonic transducer and the sample. This can be achieved either by immersing the wafer and chuck into a water bath, using a "bubbler" to create a waterfall of water from the transducer location down to the sample, or using a water coupler to create a pressurized film of water between the transducer face and the sample surface.

Finally, the sample is inspected. This inspection may be performed by a raster scan over the wafer and sending out an ultrasonic pulse at specific locations to generate reflections from the sample at each (x, y) position. These reflected signals are evaluated to produce images of each interface that can be analyzed for defects in the overall wafer area or in specific semiconductor device areas. Other scanning techniques and processes may also be used.

With more advanced design bonded device wafers, such as Back Side Illuminated (BSI), CMOS, and MEMS wafers, there may be openings to the interior of the bonded wafer pair that could allow water to ingress. This water ingression could lead to the changing of the material properties internal to the bonded wafer pair or contamination of cavities in the bonded wafer pair. This can result in damaged devices or false or missed failure results. Therefore, water couplers which remove water outside the portion of the bonded device wafer being inspected are used to limit water contact during an inspection.

However, in some cases, a sponge-like material may be present close to the edge of the object, which may be a bonded wafer. The air cavities in this material will reflect the ultrasound creating a bright ring in the ultrasonic image that hides, or occludes, the presence of any actual air type defects in the bonded device wafer layers. Since the material is sponge-like, it can absorb water, changing its ultrasonic properties and allowing the ultrasound to propagate to the internal layers of interest.

The wetting of this sponge-like material may be accomplished by doing a first scan of all or a portion of the wafer simply to allow water to be absorbed, and then performing a second scan to do the inspection. However, this adds to the scan time required, thereby reducing the system throughput, and also additionally wets the top of the wafer, which may be undesirable.

Therefore, there is a need to rapidly wet the edges of the bonded device wafer so that the sponge-like material can absorb water before the ultrasonic inspection without significantly increasing the scan time.

The present disclosure relates to a specialized attachment, which may be attached, or used in conjunction with a fixture, such as a wafer chuck.

The invention may be used in conjunction with a typical source of water to couple the ultrasound. For example, the invention may be turned on for a short period of time before the scan starts to wet the edges of the bonded device water. Then, the inspection scan is performed using water couplers, bubblers, or squirters.

Alternatively, the invention may be used to create a film of water on the full surface of the bonded device wafer in addition to wetting the edges, so that water from a second source is not needed during the inspection. In the latter case, the film of water must be thick enough to fully contact the ultrasonic transducer. The ring may be kept on throughout the scan such that a water coupler is not required, i.e., the pre-wet ring, or frame (as shown herein as element 102) maintains the water film throughout the scan.

At slower scan speeds, this film of water may be enough to maintain coupling of the ultrasound to and from the sample during the full scan of the sample, but as the scan speed increases, it may be necessary to replenish the water supply during the scan by continuing to supply water from the pre-wet device. The ability to wet the surface as well as the edge of the bonded device wafer is dependent on the placement, angle, and shape of the water injection nozzles discussed below.

Embodiments of the disclosure may be considered as including a "pre-soak" and a "scan-soak". The pre-soak component includes providing couplant to an edge surface of an object, such as a bonded wafer. The scan-soak component includes providing couplant to a surface of the object, such as a horizontal surface of a bonded wafer to perform ultrasonic scanning.

The pre-soak may be accomplished prior to or during the scan soak and involves the use of one or more sets of nozzles.

When utilizing two or more sets of nozzles, a first set of nozzles with a first fluid vector trajectory and a second set of nozzles with a second fluid vector trajectory can be used to deposit fluid on an edge surface of an object. The second fluid vector trajectory interacts with the first fluid vector trajectory, resulting in a resultant fluid vector trajectory. The interaction between the first fluid vector trajectory and the second fluid vector trajectory may be a combination, interference or other interaction that changes the first fluid vector trajectory based, at least in part, on the second fluid vector trajectory. The resultant fluid vector trajectory causes couplant, or fluid, to impact an edge surface of the object to produce a wetting or soaking prior to fluid being deposited on a scan surface, which may be a horizontal surface of the object.

The scan soak involves depositing couplant, or fluid, on a scan surface of an object. The nozzles used for pre-soak, or a sub-set of the nozzles used for pre-soak, may be used to deposit fluid on the scan surface. Alternatively, scan soak nozzles may be used to deposit the fluid on the horizontal surface so the scanning may be performed. The scan soak process may utilize bubblers and/or water couplers with the nozzles to deposit couplant on a wafer surface to be inspected. For example, the pre-soak nozzles may perform the pre-soak function, typically depositing fluid on an edge surface, and then water couplers and/or bubblers used alone or in combination deposit couplant for the scanning operation.

FIG. 1 shows a top view of an apparatus 100 according to an embodiment of the disclosure.

As shown in FIG. 1, the apparatus 100 includes a frame, or ring, 102, a chuck 103, water supply fittings 104, 106, 108, 110, 112 and 114. Knob screw 116 is also shown. Regions, or areas 122, 124, 126, 128, 130, 132, 134, 136 and 138 may be used to provide a vacuum for the chuck to hold a wafer in a desired position. The chuck 103 is used to hold the wafer in place on the apparatus 100. The chuck 103 may achieve this by using one or more vacuums to secure a bottom surface of the wafer to the chuck 103. Openings 140, 142, 146 in frame 102, are used to secure the chuck 103 to another structure (not shown).

A first set of a plurality of nozzles 120(a) . . . (n) where "n" is any suitable number are shown. This set of nozzles, generally 120 are shown using an upper ring surface 121. A second set of nozzles, not shown in FIG. 1, 150(a) . . . (n), where "n" is any number are disposed on upper ring 148. The second set of nozzles, generally 150 are described and shown herein. The first set of nozzles 120 and the second set of nozzles 150 are coupled to a source of couplant (not shown in FIG. 1) that provides couplant to be injected out of the first set of nozzles 120 and the second set of nozzles 150.

As shown in FIG. 1 one embodiment of the disclosure is a frame 102, which may be any desired shape, including square, rectangular, circular, semi-circular, elliptical or other shape. The shape of the frame 102 depends on the object, which may be a bonded wafer. Specifically, since, currently, most bonded wafers are circular in shape, or round, a full ring instantiation of a pre-wet device 100 mounted onto a typical wafer chuck 103 is one useful example. The frame 102 may also be referred to as a pre-wet frame, pre-soak frame or ring.

In this example, the pre-wet ring, or frame, 102 has 186 water injection nozzles surrounding the wafer area so that the full wafer may be rapidly and effectively wetted. Two sets of a plurality of three-dimensional cone-shaped nozzles 120, 150 (nozzles 150 not shown in FIG. 1) are aimed towards the center of the wafer to help water to stay in the concentric circle of the wafer. Four knob screws (two knob screws 116 and 160 are shown in FIG. 1) allow adjustment of a gap, or space, between the wafer and the ring, and four ring holding bars shown in FIG. 2B secure the pre-wet frame 102 to the chuck 103. Additionally, while a single frame 102 is shown in FIG. 1, it is also an embodiment that any suitable number of frames (additional frames not shown) may be used in conjunction with each other. For example, a plurality of frames may be positioned to deposit fluid on an object, such as a wafer. The frames may be stacked vertically on top of one another or positioned so various frames are proximate to various portions of a fixture, such as a wafer chuck.

The plurality of frames may include one or more semi-circular shaped frame structures, substantially circular frame structures, or any suitable shape. In an embodiment having substantially circular, or semi-circular design, the frames may be concentric or may overlap. In an embodiment having polygon-shape, the polygon frames may be sized to be concentric to provide rows of nozzles, which may overlap or may not have overlapping areas or regions. For example, the frames, regardless of shape may be concentric, coaxal, or coaxial by sharing a common center or axis. The nozzles may be disposed in any portion of the frame and any desired depth from the edge of the frame. The frames may have any suitable number of nozzles at any suitable portion to provide couplant to an object, such as a wafer.

Each frame, or the plurality of frames, may have associated nozzles, which may include pre-soak nozzles and/or scan soak nozzles. Additionally, while nozzles 120, 150 and 151 are shown herein, any suitable number of rows of nozzles may be used. These nozzles may be fabricated, for example, using a three-dimensional (3-D) printer to produce nozzles having desired dimensions, orifice, and slant to produce a desired fluid discharge trajectory. The nozzles as described herein (120, 150, 151) can be designed to provide, or deposit, fluid on any portion of an object, such as a wafer. For example, side nozzles (120, 150) may deposit fluid on a horizontal, or scan surface of an object, such as a wafer.

Figure 2A:
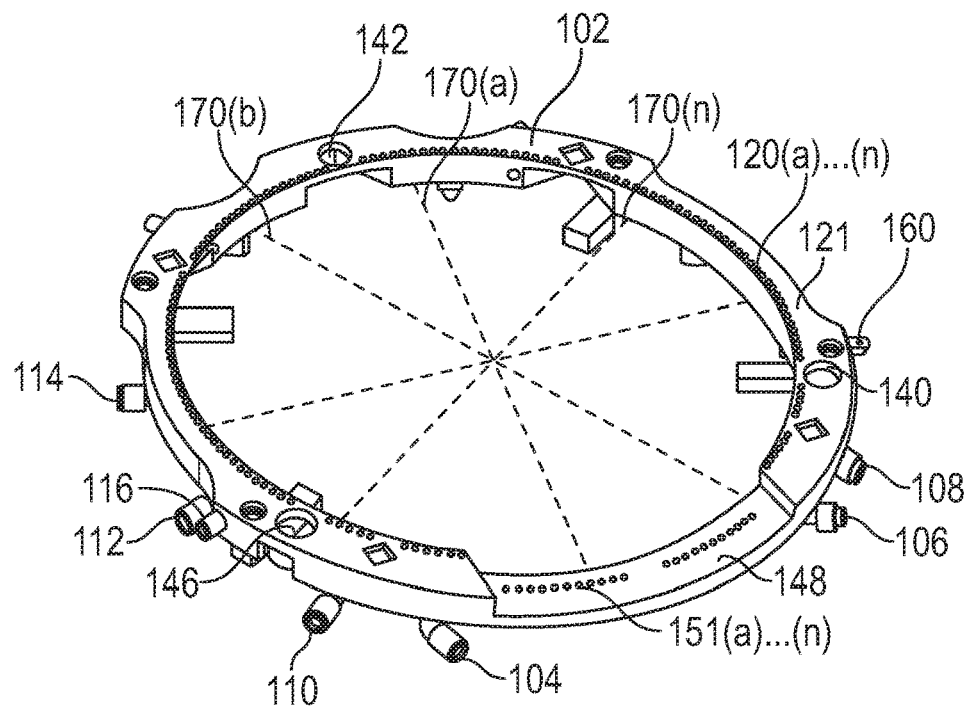
FIGS. 2A and 2B show top and bottom views, respectively, of a full-ring embodiment of the disclosure, respectively.
Figure 2B:
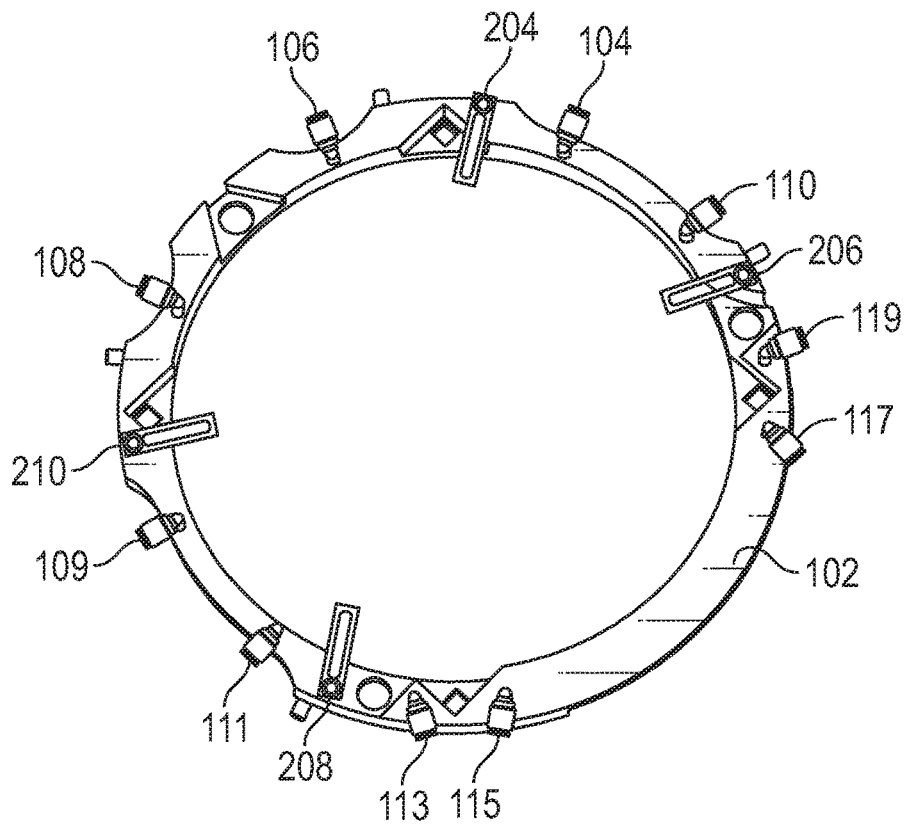

FIGS. 2A and 2B show top and bottom views, respectively, of a frame 102 embodiment of the disclosure, respectively showing top and bottom views of the full ring version of the pre-wet device showing the ten water supply fittings and the four ring holding bars to secure the device to the chuck, shown in FIG. 1 as element 103.

FIG. 2A shows a top view of pre-wet ring, or frame, 102 with upper layer 121 having first nozzles 120(a) . . . (n) where "n" is any suitable number. Upper layer 121 also has a second plurality of nozzles (shown in other Figures herein, as nozzles 150). Lower layer 148 has center nozzles 151(a) . . . (n), where "n" is any suitable number. Nozzles 150 are shown in other figures herein.

For ease of illustration, and clarity of description, nozzles 120 and 150 may be thought of as pre-soak nozzles and nozzles 151 may be thought of as scan soak nozzles. The nozzles 151 (scan soak nozzles) may also be used during pre soak, since the trajectory of discharge from the scan soak nozzles 151 may deposit couplant on an edge surface of the wafer as well as the horizontal scan surface of the wafer. Also, the surfaces and positions of the nozzles 120, 150, 151 may be altered and modified as desired. The embodiments described herein represent one instantiation of the possible embodiments.

The frame 102 is shown as circular in shape. Any desired shape for frame 102 may be used based on the shape of the object. The frame 102 having surface 121 to support nozzles 120 (and 150 as shown herein). The nozzles 120, 150 on surface 121 may be pointed so as to provide fluid or couplant to an edge of an object.

Alternatively, the nozzles 120, 150 may be mounted in surface 121 so that the edge of an object, such as a wafer abuts the distal portion of the nozzles 120, 150. Thus, the frame 102 may have the nozzles positioned so that the nozzles are not visible when a wafer is mounted in the chuck (103 herein).

The nozzles 120, 150 may be disposed at any portion of frame 102, that is they may be completely around the circumference, or any portion of the circumference of frame 102. When the frame is another shape, such as rectangle, square, elliptical or other shape, the nozzles 120, 150 may be disposed at any desired location on the frame.

Portion, or surface 148 has nozzles 151(a) . . . (n) where "n" is any suitable number, disposed thereon. The nozzles 151 may be scan soak nozzles used to deliver fluid or couplant to a horizontal, or scan surface of the object, such as a wafer. The scan soak nozzles 151 may be on any portion of the frame 102. The nozzles 151 may also be disposed on surface 121, which is the same surface as pre-soak nozzles 120, 150.

Alternatively, pre-soak nozzles 120, 150 may be on surface 148, which is shown as a surface supporting nozzles 151.

Inlet couplings, also described as water supply fittings, 104, 106, 108, 110, 112 and 114 are shown. Adjustment knobs 116 and 160 are shown. Openings 140, 142 and 146 are also shown. Graphic lines 170(a) . . . (n) where "n" is any suitable number are shown. While radial lines, generally 170 are shown, grid lines along a horizontal and/or vertical lines may also be used.

Water supply fittings 104, 106, 108, 110, 112 and 114 may be 6 millimeter outer diameter couplant supply tubing to provide couplant from a couplant source (not shown) to the nozzles 120, 150 (generally). Alternatively, any suitable tubing or conduit material may be used.

Adjustment knobs 116 and 160 are used to adjust a gap, or spacing between a wafer and the frame.

Openings 140, 142 and 146 are used to secure the chuck to a supporting surface (not shown).

Graphic lines 170(a) . . . (n) where "n" is any suitable number are used to determine fluid deposition on a surface. The lines 170 (generally) divide a horizontal surface into granular sections to facilitate examination of a surface.

FIG. 2B shows a bottom view of full frame, or ring 102. This view shows holding bars 204, 206, 208 and 210.

Also shown in FIG. 2B are inlet fluid fittings 104, 106, 108, 109, 110, 111, 113, 115, 117 and 119. The fittings 104, 106, 108, 109, 110, 111, 113, 115, 117 and 119 are used to provide couplant, such as water, or other suitable fluid for inspecting an object, such as a wafer, to the associated nozzles (120, 150 and 151), as described herein.

Holding bars 204, 206, 208 and 210 may also be clips, or pins that are suitable to hold the frame 102 to chuck 103.

For example, ten independent internal water chambers supply water into the nozzles without fluctuation (FIGS. 3A, 3B) and are themselves supplied with water through ten water supply tube fittings (FIGS. 2A, 2B). FIG. 4 shows additional top and bottom views of the full ring pre-wet device.

Figure 3A:
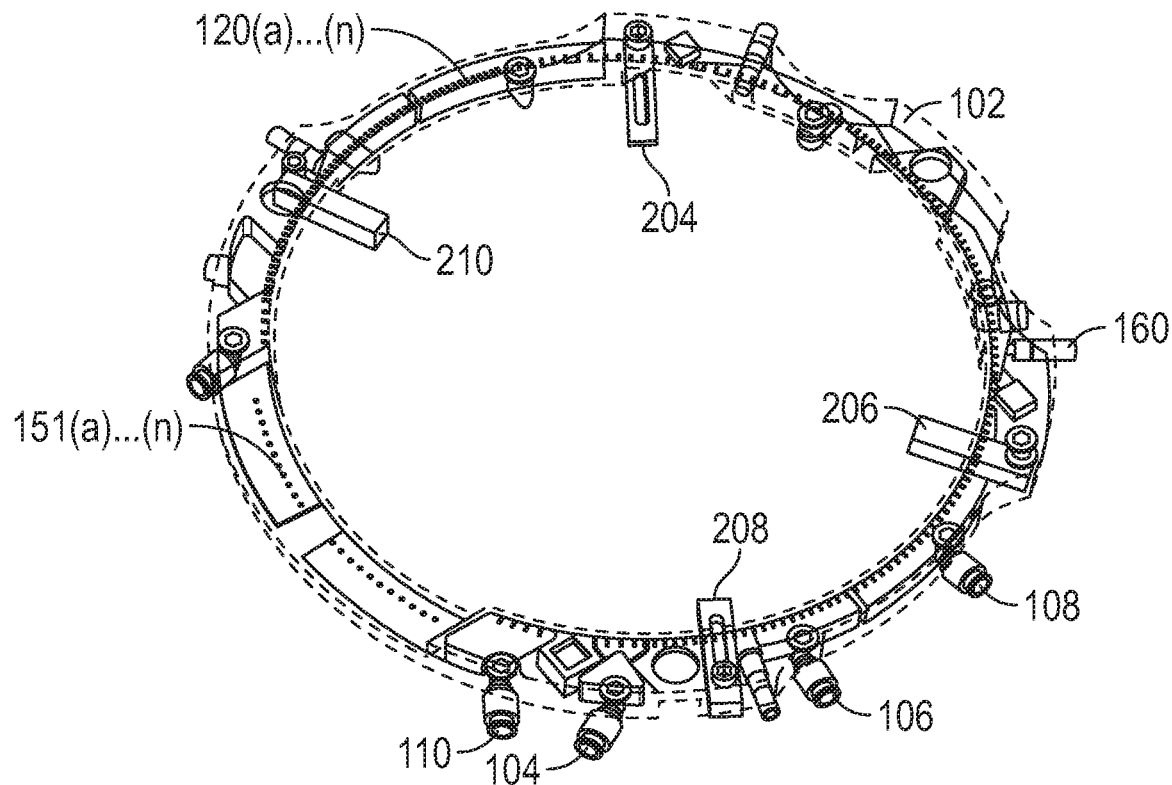
FIGS. 3A and 3B show top and bottom views, respectively, of a full-ring embodiment showing water chambers.
Figure 3B:
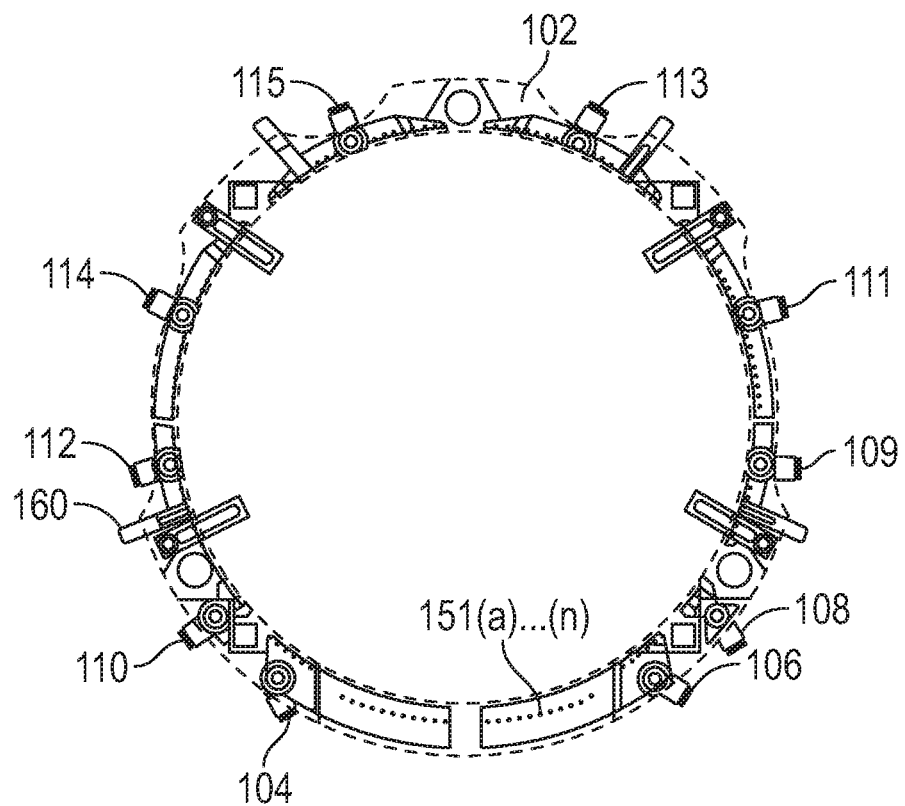

FIGS. 3A and 3B show top and bottom views, respectively, of a full-ring embodiment showing water chambers. A top view, FIG. 3A, shows the support frame 102 with nozzles 151(a) . . . (n), holding bars 204, 206, 208 and 210, nozzles 120(*a*) . . . (*n*) and inlet fittings or water inlet couplers 104, 106, 108, 110. The nozzles 151(*a*) . . . (*n*) are a plurality of nozzles configured to provide couplant to a horizontal surface of an object, such as a wafer under inspection.

Nozzles 120(*a*) . . . (*n*) are configured to provide couplant to an edge surface of an object, such as a wafer. The couplant discharged by nozzles 120 is discharged to the edge surface of the object, such as a wafer, prior to couplant from nozzles 151 being discharged to a horizontal surface of the object, or wafer. Thus, application of couplant to the edge surface permits a pre-soak, or prior wetting to the edge of a wafer before couplant is applied to the horizontal surface of the wafer.

FIG. 3B shows an inverted or lower perspective view of ring, or frame, 102. The elements shown in FIG. 3B have been discussed in relation to FIG. 3A.

FIGS. 3A and 3B show two translucent views of the full frame, or ring, version of the pre-wet device noting the ten independent internal water chambers, which supply water to the nozzles without fluctuation.

Figure 4A:
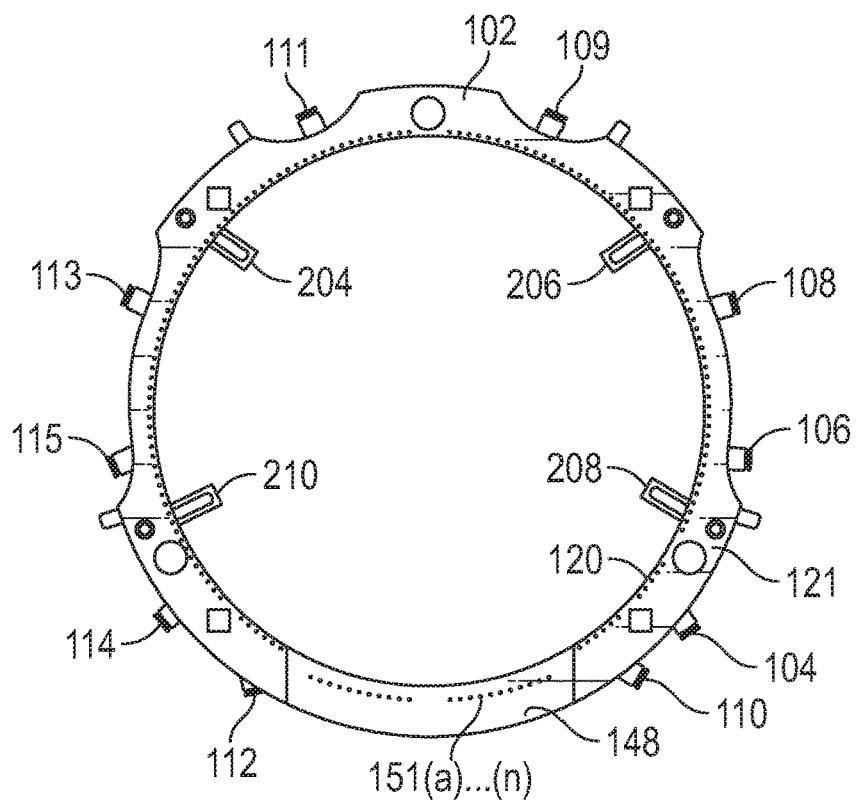
FIGS. 4A and 4B show top and bottom views, respectively, of a full-ring embodiment.
Figure 4B:
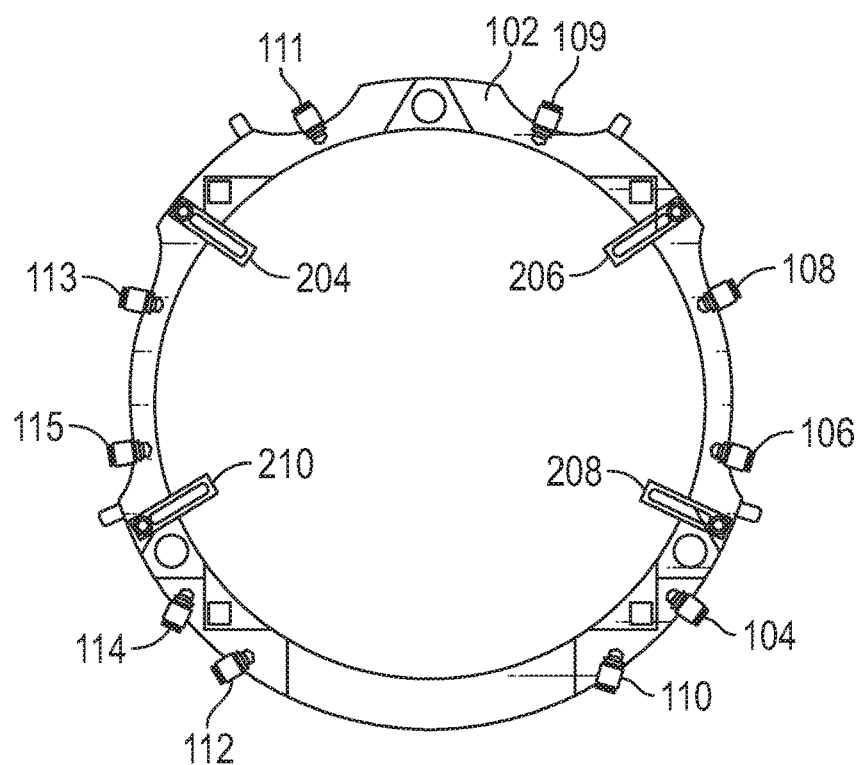

FIGS. 4A and 4B show top and bottom views, respectively, of a full-ring, or frame, embodiment.

As shown in FIG. 4A, the ring 102 shows nozzles 151 on surface 148. Upper layer 121 has nozzles 120. Also shown are clips, or hold bars 204, 206, 208 and 210.

FIG. 4B shows the support frame 102 from a lower perspective. The elements shown in FIG. 4B have been discussed in relation to FIG. 4A.

The pre-wet ring may be made out of a variety of materials; however, a seamless one-body design based on the 3D printing technique reduces undesired water leakage or pressure loss.

Figure 5:
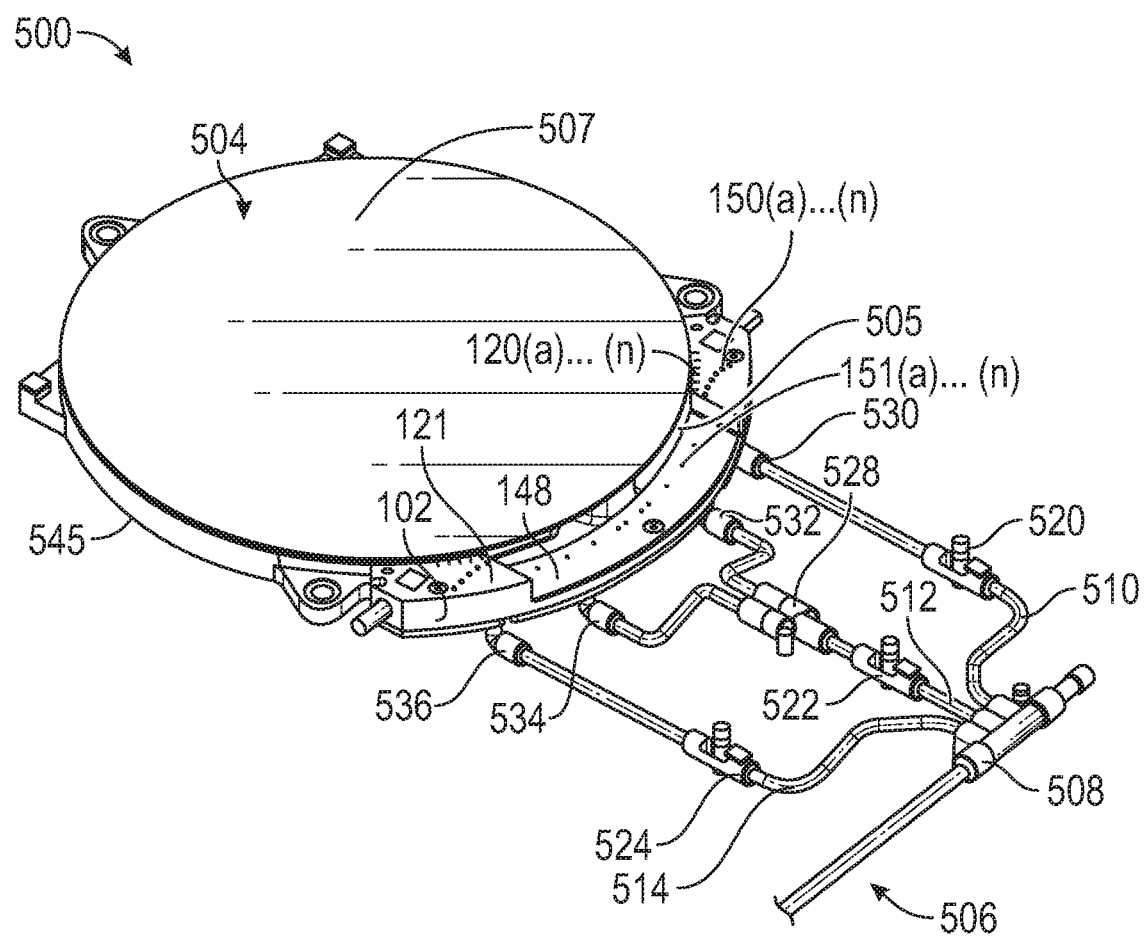
FIG. 5 shows an example embodiment of an apparatus for dispensing fluid to an object, according to the disclosure.

FIG. 5 shows an embodiment of apparatus 500 for dispensing fluid to an object, according to the disclosure. Apparatus 500 includes a fixture 545, which supports object 102, and a frame 102. Also shown are water supply fittings, or inlet fluid fittings, 506, 508, 520, 522, 524, 528, 530, 532, 534 and 536.

Object 504 is supported by fixture 545. In the embodiment shown, object 504 is a wafer or dual bonded wafer and fixture 545 is a wafer chuck that supports or secures the wafer. Other objects may be held or supported or secured by the other fixtures. The object, or wafer, 504 may be inspected using an ultrasonic transducer. The wafer 504 may have an absorbent cross-section portion along edge surface 505, which would benefit from a pre-soak, or pre-wet prior to couplant being dispersed on a horizontal surface 507 of the wafer 504.

The chuck 545 supports frame 102. The frame 102 has nozzles 120(*a*) . . . (*n*), 150(*a*) . . . (*n*) and 151(*a*) . . . (*n*), where "n" is any suitable number.

Nozzles 120 and 150, disposed on surface 121, discharge couplant to an edge surface 505 of wafer 504. The nozzles 120, 150 could also discharge couplant to an upper surface 507 of wafer 504.

Nozzles 151, disposed on surface 148, discharge couplant to horizontal, or top surface 507 of wafer 504.

In one embodiment, nozzles 120 and 150 discharge couplant to edge surface 505 before, or prior to nozzles 151 discharging couplant to horizontal surface 507.

Alternatively, the nozzles 120, 150 could discharge couplant at the same time as nozzles 151 are discharging couplant.

Inlet fitting 506 provides couplant to nozzles 120, 150 and 151 via various tubes and valves. The tubes include 510, 512 and 514. The valves include 520, 522, 524, 528. Inlet couplings 530, 532, 534 and 536 are similar to the inlet couplings shown herein as 104, 110, 112 etc. The inlet couplings, or inlet fittings, provide a conduit for couplant to flow from the tubes and valves to the associated nozzles for discharge to a desired portion of the wafer 504.

FIG. 5 shows a semicircular, sectional version of the pre-wet device mounted onto a typical wafer chuck with a wafer present on the chuck. The sectional version of the device allows for the pre-wetting only to be applied to a smaller portion of the bonded device wafer. For example, the portion of the wafer that will be inspected first. Since the water can wick along the ring of the sponge-like material, the rest of the sponge-like material will wet itself as the scan progresses using the water in the pre-wet section of the sponge-like material.

Figure 6A:
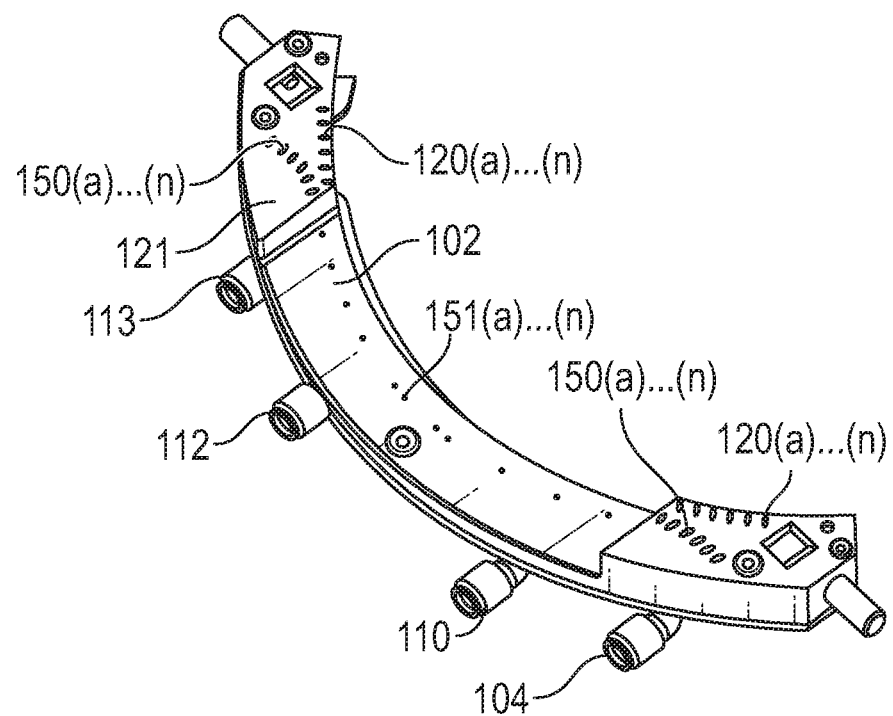
FIGS. 6A and 6B show top and bottom views, respectively, of an embodiment of a portion of the frame according to an embodiment described herein.
Figure 6B:
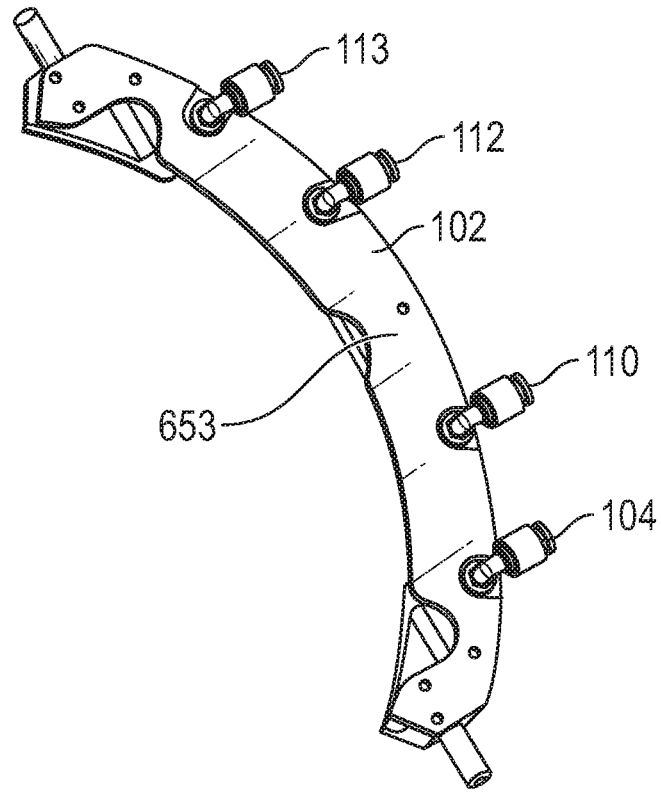

FIGS. 6A and 6B show top and bottom views, respectively, of a portion of the frame, or ring 102 according to an embodiment described herein. The portion shown is a semicircular portion of the frame 102. The frame could be any desired shaped, typically based on the shape of the object under inspection.

FIG. 6A shows a portion of the frame, or ring, 102 having two sets of side nozzles 120 and 150. Center nozzles 151 are shown disposed on a section of the support plate 102. Inlet couplings 104, 110, 112 and 113 are also shown.

Figure 12C:
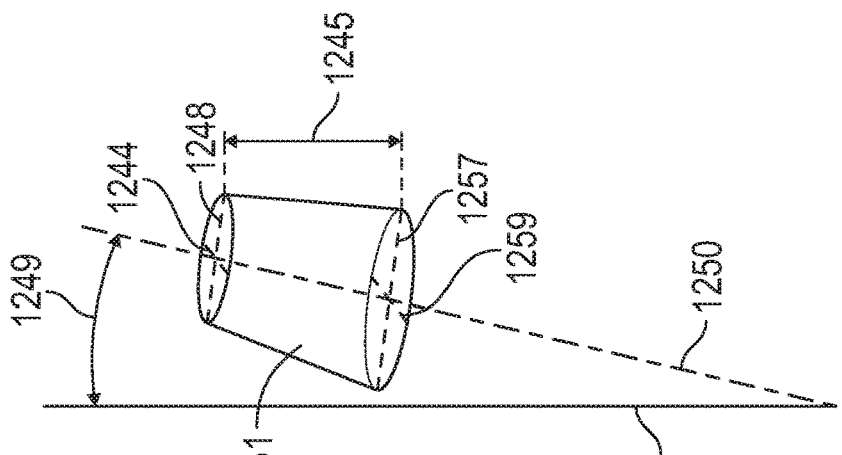
FIGS. 12A, 12B and 12C show an embodiment of three angled tips of a nozzle according to the disclosure.
Figure 12B:
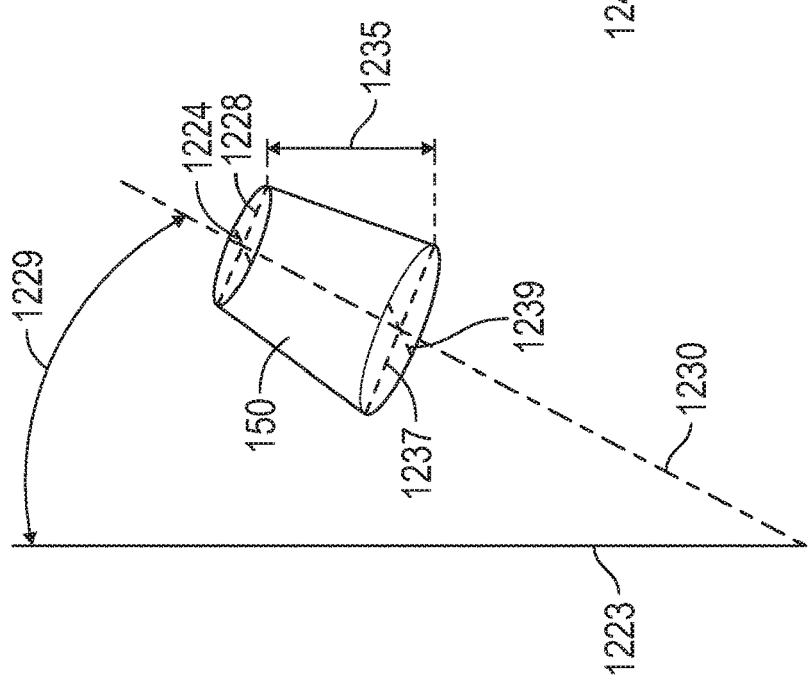
Figure 12A:
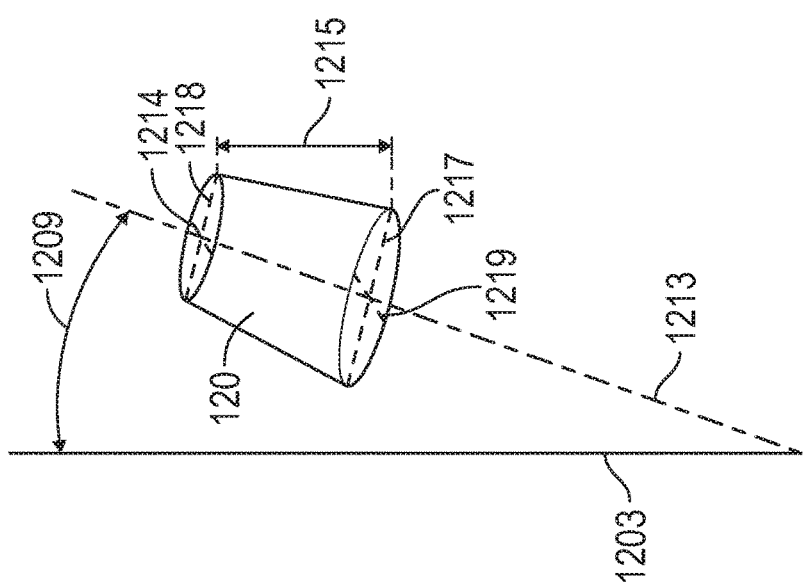

Side nozzles 120 have a position, slant and orifice shaped to discharge couplant at a desired rate, angle and trajectory. Additional detail is shown in FIG. 12A herein.

Side nozzles 150 have a position, slant and orifice shaped to discharge couplant at a desired rate, angle and trajectory. Additional detail is shown in FIG. 12B herein. The trajectory of the couplant discharged from one or more of the nozzles 150 interfaces with the discharge from one or more of nozzles 120.

The trajectory of the interfaced discharge from nozzles 120 and 150 are designed such that the composite, or resultant discharge from the two sets of the plurality of nozzles spray onto the edge surface of the wafer (edge surface shown as element 505 and wafer shown as element 504 herein).

Center nozzles 151 have a position, slant and orifice shaped to discharge couplant at a desired rate, angle and trajectory. Additional detail is shown in FIG. 12C herein. The desired location for couplant discharged from nozzles 151 is the horizontal surface of a wafer (horizontal surface shown as element 507 and wafer shown as element 504 herein).

Inlet couplings, or inlet fittings, 104, 110, 112 and 113 provide a conduit for couplant to flow from a couplant source (not shown) to associated ones of nozzles 120, 150 and 151 as desired, for discharge onto an edge surface (e.g., via nozzles 120, 150) or a horizontal surface (e.g., via nozzles 151) of a wafer.

FIG. 6B shows a bottom view of a portion of the frame 102. The inlet couplant couplings, or fittings, 104, 110, 112 and 113 are shown. A plate 653, which is shown as a stainless steel support plate is also shown. The plate 653 provides additional support to the frame 102.

The semicircular, sectional, pre-wet frame 102 may be made out of a variety of materials; however, a seamless one-body design based on the 3D printing technique minimizes the turbulence of the water flow and reduces undesired water leakage or pressure loss. However, in this case, the 3D printed semicircular sectional pre-wet device needs additional support to protect against deformation, so it is mounted to a support plate using assembly screws (FIG. 6). The support plate also allows for mounting to the wafer chuck. Set screws and knob screws (FIG. 6) are then used to adjust the position of the semicircular, sectional pre-wet device relative to the wafer edge.

In this example, 12 center nozzles and 24 side nozzles wet the portion of the wafer near the pre-wet device (FIG. 6). The angle of the 12 cone-shaped nozzles distributed in the center may be optimized to wet only the front edge of the wafer. The side nozzles may be arranged in two rows such that the water flow from the back row interferes with the water flow from the front row to keep the trajectory low to minimize splashing effects and to pre-wet the edge of the wafer.

Figure 7:
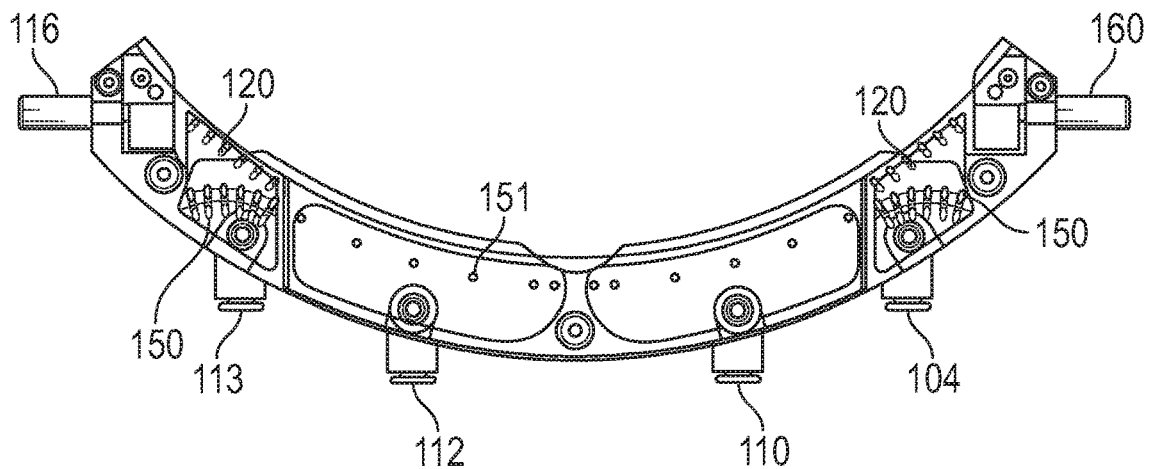
FIG. 7 shows a view of a semicircular sectional embodiment according to the disclosure.

FIG. 7 shows a view of a semicircular sectional embodiment according to the disclosure. As shown in FIG. 7, a semi-circular portion of ring (shown as element 102 herein) has a first set of a plurality of side nozzles 120, a second plurality of side nozzles 150 and a plurality of center nozzles 151. Inlet couplant couplings 104, 110, 112 and 113 and knobs 116 and 160 are also shown. While a portion of a single frame (frame described as e.g., element 102 herein) is shown, it is also an embodiment that any suitable number of frames (additional frames not shown) may be utilized.

For example, a plurality of frames (e.g., 102 herein) may be positioned to position associated nozzles to deposit fluid on an object, such as a wafer. The frames may be stacked vertically on top of one another or positioned so various frames are proximate to various portions of a fixture, such as a wafer chuck. The plurality of rings, or frames may be concentric, overlapping or have a similar geometry, or different geometry, so as to provide a desired positioning of the associated nozzles for that ring, or frame. This permits desired fluid deposition on a desired portion of an object. Each frame, or the plurality of frames, may have associated nozzles, which may include pre-soak nozzles and/or scan soak nozzles. Additionally, while nozzles 120, 150 and 151 are shown herein, any suitable number of rows of nozzles may be used.

As shown in FIG. 7, while a single row of each type of nozzle (120, 150) are shown, it is an embodiment of the disclosure that there may be multiple rows of each type of nozzle (120 and 150) used in any combination. For example, there may be a row of nozzles 120, a row of nozzles 150, a row of nozzles 120 etc. There may also be any combination of types of nozzles in a row or any combination of rows having a particular type of nozzle. For example, a row of a first type of nozzle (120) a row of a second type of nozzle (150) and a row of a third type of nozzle (151).

As stated herein, these nozzles may be fabricated using a three-dimensional (3-D) printer to produce nozzles having desired dimensions, orifice, and slant to produce a desired fluid discharge trajectory. The nozzles as described herein (120, 150, 151) can be designed to provide, or deposit, fluid on any portion of an object, such as a wafer. For example, side nozzles (120, 150) may deposit fluid on a horizontal, or scan surface of an object, such as a wafer. Nozzles 151 may be used to deposit fluid on an edge portion of an object, such as a wafer.

Also, there may be a plurality of rows of nozzles 151 to deposit fluid on an object. It is also an embodiment that any type of nozzle 120, 150, 151 may be used to deposit fluid on any portion (edge, horizontal) of an object, such as a wafer. Thus, a single type of nozzle, such as any one of 120, 150 or 151, may be used instead of using multiple nozzle types.

Four independent internal water chambers supply water into the nozzles without fluctuation (FIG. 7) and are themselves supplied with water through four water supply tube fittings (FIG. 6). FIG. 8 shows additional top and bottom views of the semicircular, sectional, pre-wet device.

Figure 8A:
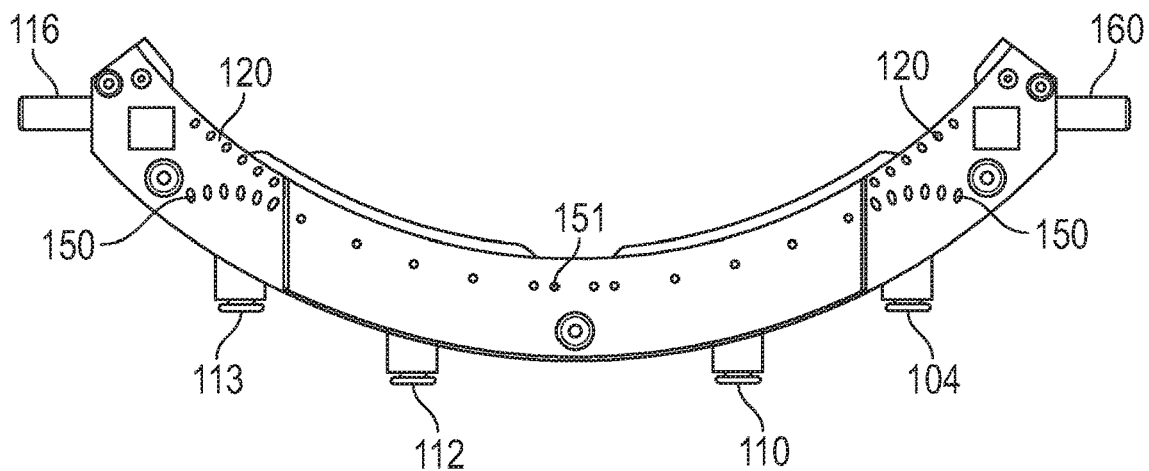
FIGS. 8A and 8B show top and bottom views, respectively, of a semi-circular embodiment described herein.
Figure 8B:
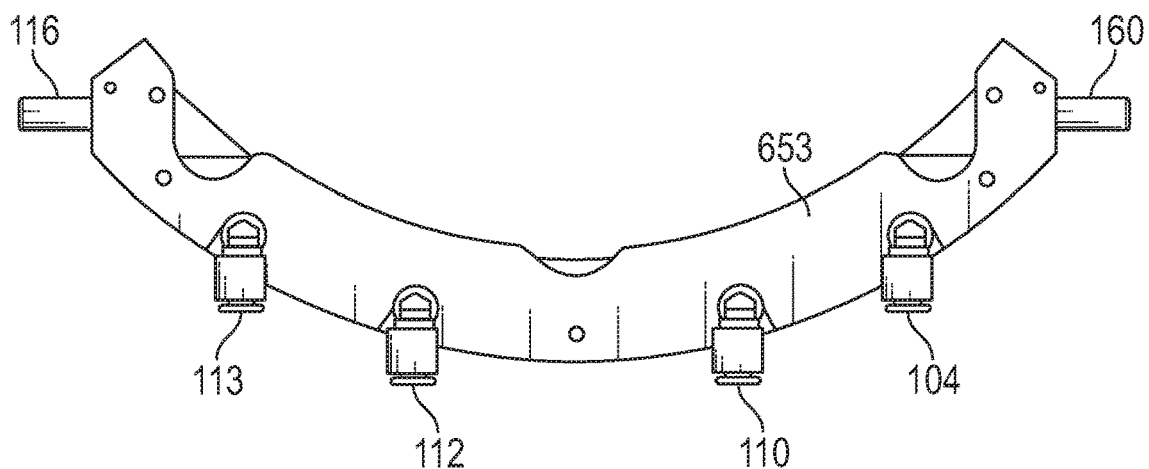

FIGS. 8A and 8B show top and bottom views, respectively, of a semi-circular embodiment described herein.

FIG. 8A shows a sectional view of the frame 102. The view of FIG. 8A includes a first set of a plurality of side nozzles 120, a second set of a plurality of side nozzles 150, a plurality of center nozzles 151. Inlet fittings 104, 110, 112 and 113 are shown as well as knobs 116 and 160. FIG. 8B shows a bottom view of the section of frame 102 shown in FIG. 8A.

Figure 9:
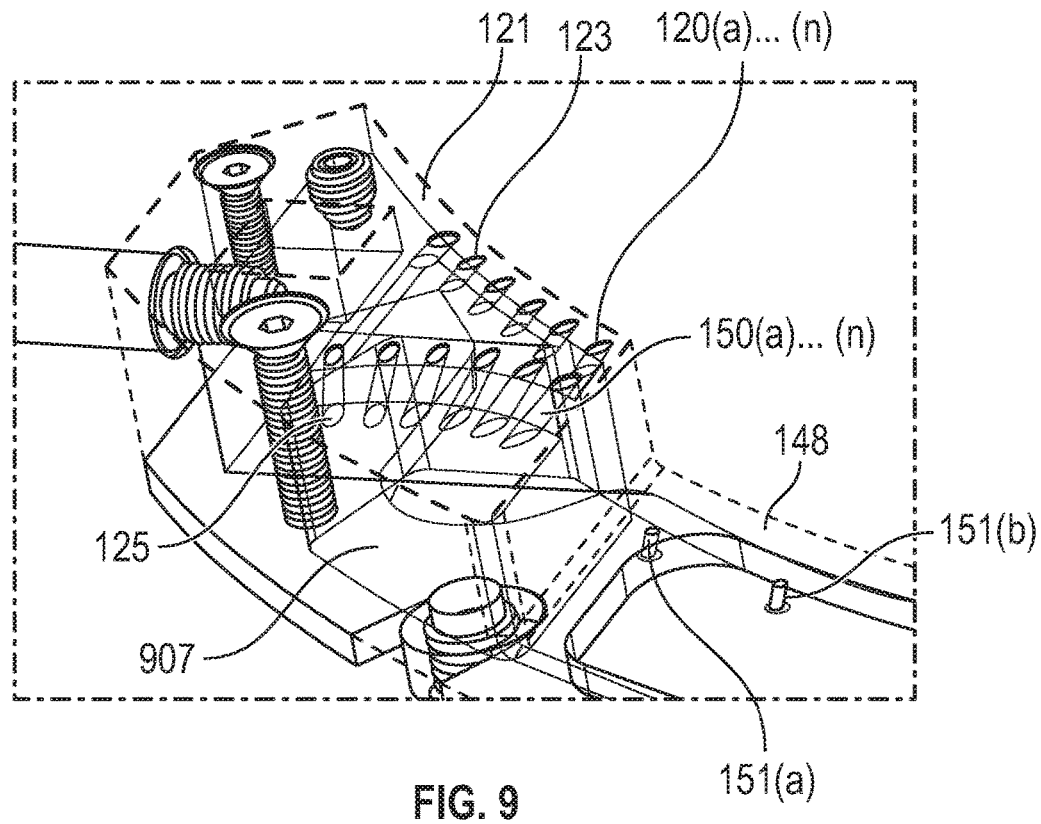
FIG. 9 shows first layer nozzle and second layer nozzle positions according to an embodiment.

FIG. 9 shows first layer nozzle and second layer nozzle positions according to an embodiment. Upper surface 121 provides a base, or support surface on frame 102. The surface 121 supports a first layer of nozzles 120(a) . . . (n) in a first region 123 and a second layer of nozzles 150(a) . . . (n) in a second region 125.

Center nozzles 151(a) and 151(b) are shown on surface region 148. Only two nozzles 151(a) and 151(b) are shown in FIG. 9 since that view does not include the entire frame 102. Any suitable number of center nozzles 151 could be used.

Internal water chamber 907 provides fluid, or couplant, to nozzles 120 and 150. Nozzles 151 also have a source of couplant, which may be chamber 907 or a different source of couplant.

Figure 10:
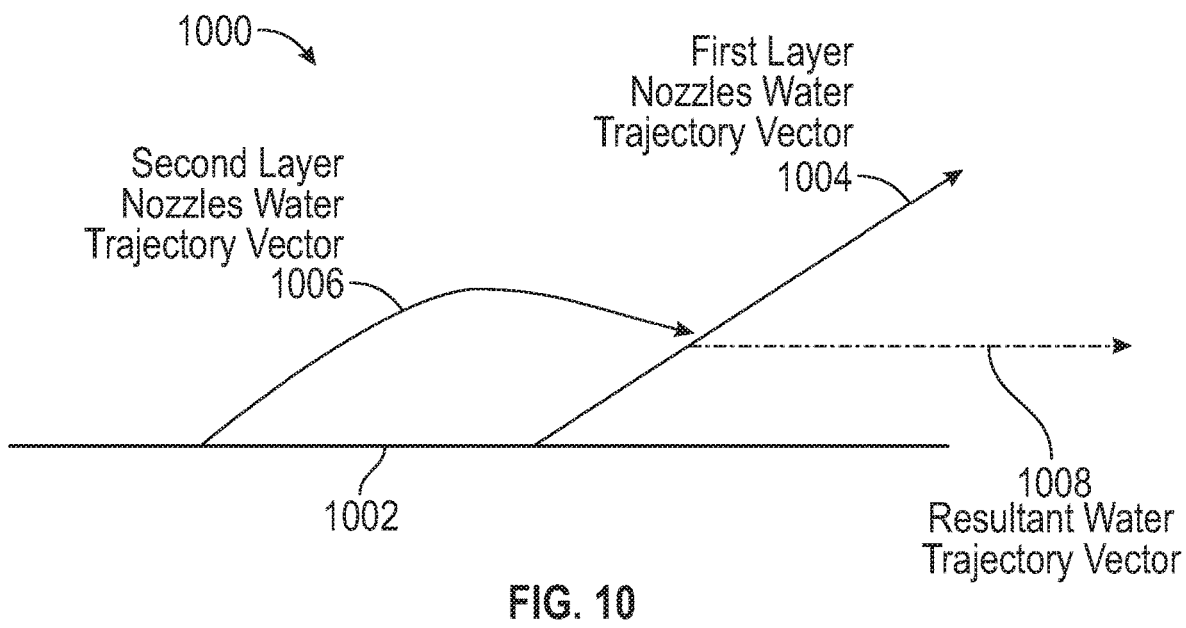
FIG. 10 shows a representation of fluid trajectory according to an embodiment of the disclosure.

FIG. 10 shows a representation 1000 of fluid trajectory according to an embodiment of the disclosure. Axis 1002 shows a basis to track couplant trajectory. A set of first layer side nozzles (shown as element 120(a) . . . (n) herein) produce a fluid trajectory vector shown as vector 1004. Line 1006 represents the couplant trajectory of a set of second layer side nozzles (shown as element 150(a) . . . (n) herein) as vector 1006.

As shown in FIG. 10, the interaction between vector 1004, which is the trajectory of the couplant discharged from a first set of side nozzles (shown as 120 herein) and the vector 1006, which is the trajectory of the couplant discharged from a second set of side nozzles (shown as 150 herein) is resultant couplant trajectory vector 1008.

The resultant couplant trajectory vector 1008 is higher than the vector 1006 and lower than the vector 1004. The velocity of the trajectory of the couplant discharged from a first set of side nozzles (120) vector 1004 is based, at least in part, on the pressure of the fluid and angle of the nozzle 120. The velocity of the trajectory of the couplant discharged from the second set of side nozzles (150) vector 1006 is based, at least in part, on the pressure of the fluid and angle of the nozzle 150.

Thus, the interaction between the vectors 1004, 1006 results in vector 1008 targeting an edge surface of the wafer. Thus, the couplant following vector 1008 will pre-soak an edge portion of a wafer. The first trajectory of fluid 1004 and the second trajectory of fluid 1006 can have a constant flow rate. Water chambers permit the flow rate to be constant and maintain a preset discharge rate.

Alternatively, the flow rate of either fluid discharge (from first nozzles or second nozzles) could be adjusted dynamically during the deposition process to target different areas during the scan. Adjustment of either fluid discharge will affect the resultant discharge, 1008. It is an embodiment to combine various and distinct nozzle flow rates to modify the resultant fluid trajectory based on the modification. This adjustment is typically achieved by controlling discharge using the components discussed herein, for example, the components described and shown in FIG. 13.

The water injection trajectory of the first layer nozzles 1004 is changed by the water trajectory from the second nozzle 1006 as discussed above. The resultant vector of the water trajectory 1008 follows the wafer edge with reduced water splash. Also, the fluid trajectories 1004 and 1006, which produce resultant fluid trajectory 1008, can also reach the scan surface of the wafer in addition to the fluid deposition on the edge surface of a wafer. Thus, the edge surface of the wafer is exposed to fluid, or couplant. This edge surface soak may be performed prior to the scan surface soak. Alternatively, the edge surface soak may occur at the same time as the scan surface soak.

Conical-shaped or frustum-shaped nozzles help to increase the water injection speed as well as the accuracy of the water trajectory.

Figure 11:
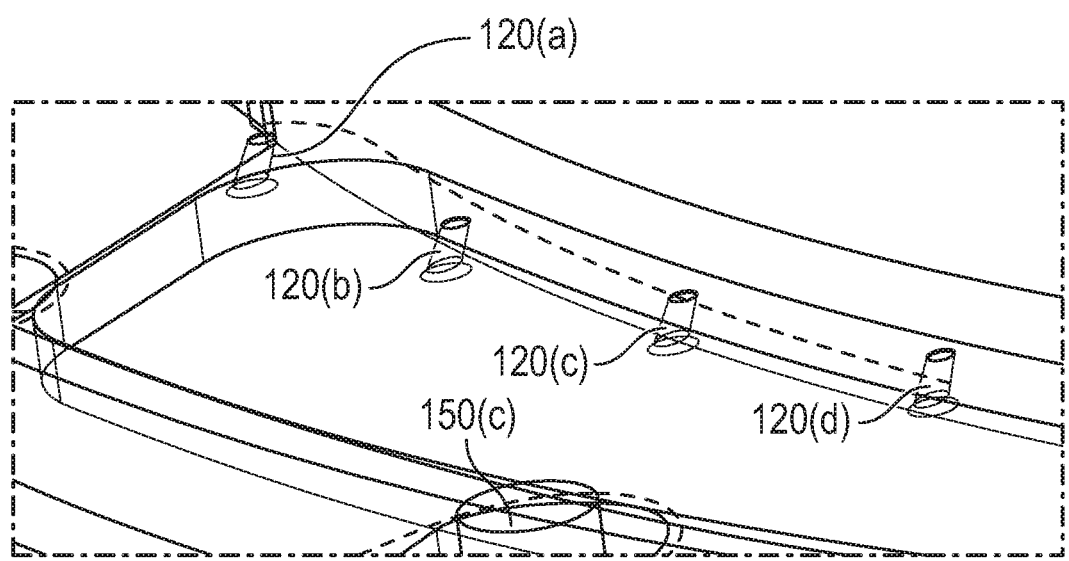
FIG. 11 shows an embodiment of a fillet shape according to an embodiment of the disclosure.

FIG. 11 shows an example of a fillet shape nozzle according to an embodiment of the disclosure. An upper surface (shown as element 121 herein) and lower surface that includes the nozzles is shown. First set of side nozzles 120(*a*), 120(*b*), 120(*c*) and 120(*d*) are shown. A second set of nozzles is represented by 150(*c*).

The view of FIG. 11 is used to illustrate a close-up view of the nozzles 120 and 150. Additional nozzles of both types 120, 150 may be disposed on additional areas of the frame, as described and shown herein. The first set of nozzles 120 are closer to an edge surface of a wafer (not shown) than the second set of nozzles 150. The shape and angle and length of the nozzles 120, 150 (as well as nozzles 151) determine the trajectory of couplant, or fluid, discharged from the nozzle tip.

FIG. 11 shows the fillet shape of the entrance of the nozzles reduces the water turbulence, which leads to smooth water flow. The optimal angle of the nozzle helps to aim the water trajectory to the edge of the wafer.

FIGS. 12A, 12B and 12C show one embodiment of three types of angled tips of a nozzle according to the disclosure. The angle tip of the nozzle shown in these figures is shaped differently.

As shown in FIG. 12A, nozzle 120 has a shaft angle 1209, which is determined by axis 1213 relative to vertical axis 1203. The shaft angle 1209 is shown to be approximately 58 degrees. This shaft angle 1209 for nozzle 120 is typically between 50 degrees and 64 degrees. Nozzle 120 has a first base dimension 1217 and a second base dimension 1219. First base dimension 1217 is shown as 2.6 millimeters and second base dimension 1219 is shown as 1.4 millimeters. First base dimension 1217 is typically between 2.2 mm and 3.0 mm. Second base dimension 1219 is typically between 1.0 mm and 2.0 mm. Nozzle 120 has a height dimension 1215 that is shown as 1.5 mm. Typically, the height 1215 for nozzle 120 is between approximately 1.0 mm and 2.0 mm.

Nozzle 120 has a tip portion with axis 1214 and axis 1218. Axis 1214 has a magnitude of 1.1 mm and axis 1218 has a magnitude of 2.4 mm. Typical ranges for axis 1214 and 1218 are between 0.8 mm and 1.4 mm and between 2.0 mm and 2.8 mm, respectively.

As shown in FIG. 12B, nozzle 150 has a shaft angle 1229, which is determined by axis 1230 relative to vertical axis 1223. The shaft angle 1229 is shown to be approximately 63 degrees. This shaft angle 1229 for nozzle 150 is typically between 57 degrees and 70 degrees. Nozzle 150 has a first base dimension 1237 and a second base dimension 1239. First base dimension 1237 is shown as 4.0 millimeters and second base dimension 1239 is shown as 1.8 millimeters. First base dimension 1237 is typically between 2.5 mm and 5.5 mm. Second base dimension 1239 is typically between 1.2 mm and 2.2 mm. Nozzle 150 has a height dimension 1235 that is shown as 3.0 mm. Typically, the height 1235 for nozzle 150 is between approximately 1.3 mm and 4.0 mm.

Nozzle 150 has a tip portion with axis 1224 and axis 1228. Axis 1224 has a magnitude of 1.1 mm and axis 1228 has a magnitude of 3.0 mm. Typical ranges for axis 1224 and 1228 are between 0.8 mm and 1.4 mm and between 2.0 mm and 4.3 mm, respectively.

As shown in FIG. 12C, nozzle 151 has a shaft angle 1249, which is determined by axis 1250 relative to vertical axis 1243. The shaft angle 1249 is shown to be approximately 28 degrees. This shaft angle 1249 for nozzle 150 is typically between 20 degrees and 34 degrees. Nozzle 151 has a first base dimension 1257 and a second base dimension 1259. First base dimension 1257 is shown as 1.6 millimeters and second base dimension 1259 is shown as 1.2 millimeters. First base dimension 1257 is typically between 0.8 mm and 3.0 mm. Second base dimension 1259 is typically between 0.7 mm and 2.0 mm. Nozzle 151 has a height dimension 1245 that is shown as 2.0 mm. Typically, the height 1245 for nozzle 151 is between approximately 1.0 mm and 3.3 mm.

Nozzle 151 has a tip portion with axis 1244 and axis 1248. Axis 1244 has a magnitude of 1.1 mm and axis 1248 has a magnitude of 2.4 mm. Typical ranges for axis 1244 and 1248 are between 0.8 mm and 1.6 mm and between 0.8 mm and 2.5 mm, respectively.

Figure 13:
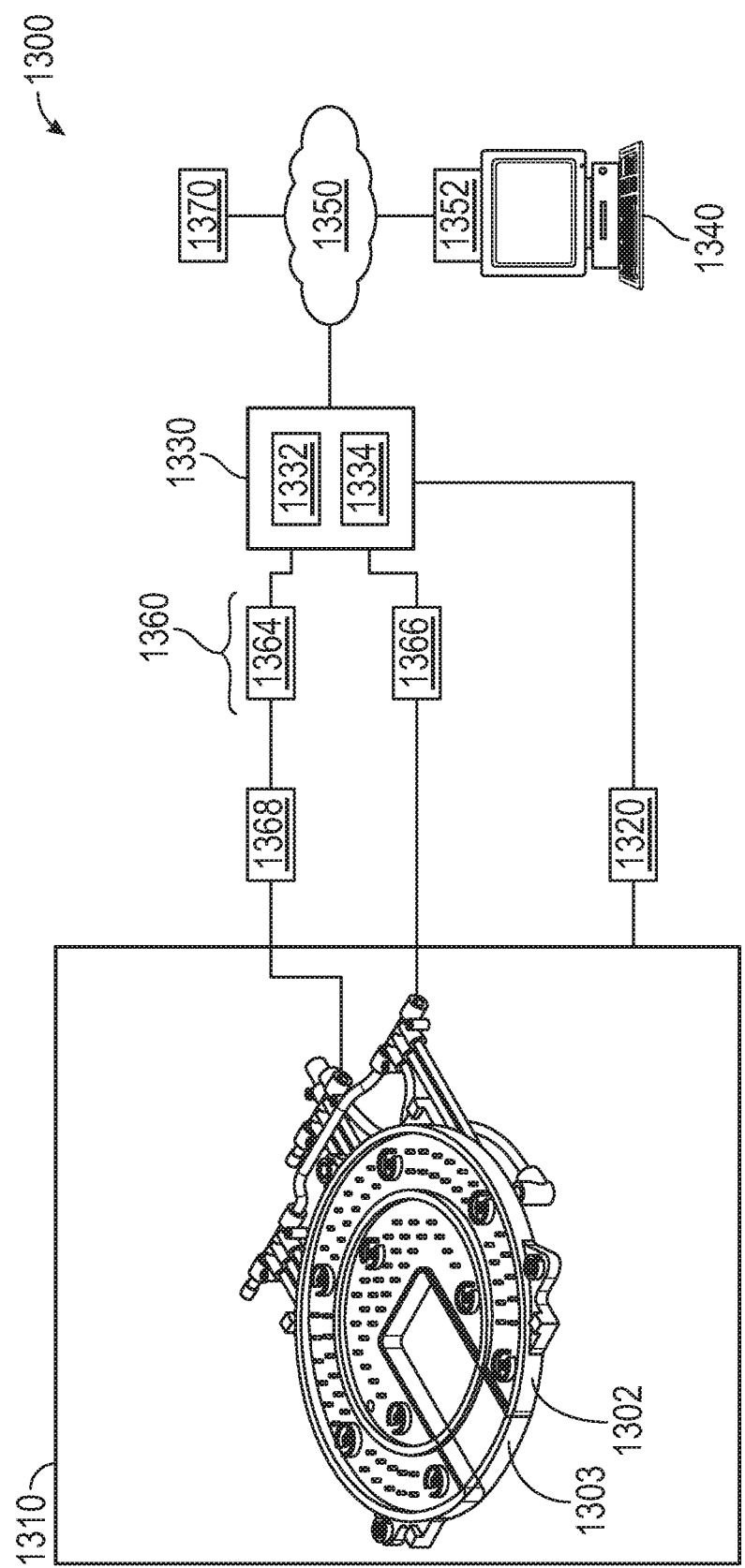
FIG. 13 illustrates a system for inspecting wafers, in accordance with a representative embodiment.

FIG. 13 illustrates a system 1300 for inspecting wafers, to which a pre-wet frame can be added or incorporated, in accordance with a representative embodiment. The inspection system 1300 may include frame 1302, which may be a pre-wet frame as described herein, a wafer chuck 1303, a scanning acoustic microscope 1310, one or more vacuums 1360 (e.g., a first vacuum 1364 and a second vacuum 1366), a water separator 1368, a positioning robot 1320, a controller 1330, a computing device 1340, a data network 1350, and other resources 1370.

The frame 1302 provides a structure to support nozzles, shown as 120, 150 and 151 herein. The frame may be a pre-wet frame that has nozzles (120, 150) disposed within the frame 1302. The frame is disposed around the wafer so that fluid, or couplant, can be discharged to an edge portion, or edge surface of the wafer.

The wafer chuck 1303 in the system 1300 is used to secure the wafer for inspection, such as ultrasonic inspection utilizing one or more transducers.

For example, the wafer chuck 1303 may include one or more vacuum zones each having a plurality of vacuum holes and a plurality of suction cups, where one or more of the suction cups is coupled with a channel for providing suction therethrough.

The design of the wafer chuck 1303 may mitigate warping of a wafer when placed thereon and when suction is applied through one or both of the channels and the vacuum holes. The suction may be provided by the vacuums 1360 (e.g., a first vacuum 1364 and a second vacuum 1366), where a water separator 1368 may be disposed in a vacuum line connecting a vacuum 1360 to the vacuum holes and channels of the wafer chuck 1303.

The wafer chuck 1303 may be configured for use with the scanning acoustic microscope 1310, where the wafer chuck 1303 holds or secures a wafer for inspection by the scanning acoustic microscope.

The positioning robot 1320 may be used to position one or more of the wafer chuck 1303, the wafers, or the scanning acoustic microscope 1310 relative to one another. A variety of arrangements and techniques are known in the art to achieve controlled movement and the positioning robot 1320 may include any of these arrangements and techniques. The positioning robot 1320 may, for example, and without limitation, include various combinations of stepper motors, encoded DC motors, gears, belts, pulleys, worm gears, threads, robotic arms, and so forth.

The controller 1330 may be in communication with one or more of the components of the system 1300 for control thereof. For example, the controller 1330 may be in communication with one or more vacuums 1360, where the controller 1330 is structurally configured to control suction in one or more of the vacuum zones on the wafer chuck 1303 through control of the vacuums 1360 or a component thereof (e.g., a valve or the like included in the vacuum 1360 or disposed on a vacuum line). The controller 1330 may also or instead be used to control the wafer chuck 1303 and its components, the scanning acoustic microscope 1310, the water separator 1368, the positioning robot 1320, the other resources 1370, and combinations thereof.

The controller 1330 may include, or may otherwise be in communication with, a processor 1332 and a memory 1334. The controller 1330 may be electronically coupled (e.g., wired or wirelessly) in a communicating relationship with one or more of the components of the system 1300.

The controller 1330 may include any combination of software and/or processing circuitry suitable for controlling the various components of the system 1300 described herein including without limitation processors 1332, microprocessors, microcontrollers, application-specific integrated circuits, programmable gate arrays, and any other digital and/or analog components, as well as combinations of the foregoing, along with inputs and outputs for transceiver control signals, drive signals, power signals, sensor signals, and the like.

In certain implementations, the controller 1330 may include the processor 1332 or other processing circuitry with sufficient computational power to provide related functions such as executing an operating system, providing a graphical user interface (e.g., to a display coupled to the controller 1330 or another component of the system 1300), set and provide rules and instructions for operation of a component of the system 1300, convert sensed information into instructions, and operate a web server or otherwise host remote operators and/or activity through a communications interface 1352 such as that described below.

The processor 1332 may be any as described herein or otherwise known in the art. The processor 1332 may be included on the controller 1330, or it may be separate from the controller 1330, e.g., it may be included on a computing device 1340 in communication with the controller 1330 or another component of the system 1300. In an implementation, the processor 1332 is included on or in communication with a server that hosts an application for operating and controlling components of the system 1300.

The memory 1334 may be any as described herein or otherwise known in the art. The memory 1334 may contain computer code and may store data such as instructions for, e.g., controlling the vacuums 1360 or a valve. The memory 1334 may also or instead store data related to performance of the wafer chuck 1303 or system 1300. The memory 1334 may contain computer executable code stored thereon that provides instructions for the processor 1332 for implementation. The memory 1334 may include a non-transitory computer readable medium.

The system 1300 may include a computing device 1340 in communication with one or more of the components of the system 1300 including without limitation the controller 1330. The computing device 1340 may include a user interface, e.g., a graphical user interface, a text or command line interface, a voice-controlled interface, and/or a gesture-based interface. In general, the user interface may create a suitable display on the computing device 1340 for operator interaction.

In implementations, the user interface may control operation of one or more of the components of the system 1300, as well as provide access to and communication with the controller 1330, processor 1332, and other resources 1360. The computing device 1340 may thus include any devices within the system 1300 operated by operators or otherwise to manage, monitor, communicate with, or otherwise interact with other participants in the system 1300. This may include desktop computers, laptop computers, network computers, tablets, smartphones, or any other device that can participate in the system 1300 as contemplated herein. In an implementation, the computing device 1340 is integral with another participant in the system 1300.

The data network 1350 may be any network(s) or inter-network(s) suitable for communicating data and control information among participants in the system 1300. This may include public networks such as the Internet, private networks, telecommunications networks such as the Public Switched Telephone Network or cellular networks using third generation (e.g., 3G or IMT-2000), fourth generation (e.g., LTE (E-UTRA) or WiMAX-Advanced (IEEE 802.16m) and/or other technologies, as well as any of a variety of corporate area or local area networks and other switches, routers, hubs, gateways, and the like that might be used to carry data among participants in the system 1300. The data network 1350 may include wired or wireless networks, or any combination thereof. One skilled in the art will also recognize that the participants shown the system 1300 need not be connected by a data network 1350, and thus can be configured to work in conjunction with other participants independent of the data network 1350.

Communication over the data network 1350, or other communication between components of the system 1300, may be provided via one or more communications interfaces 1352. The communications interface 1352 may include, e.g., a Wi-Fi receiver and transmitter to allow calculations and the like to be performed on a separate computing device 1340. More generally, the communications interface 1352 may be suited such that any of the components of the system 1300 can communicate with one another.

Thus, the communications interface 1352 may be present on one or more of the components of the system 1300. The communications interface 1352 may include, or be connected in a communicating relationship with, a network interface or the like. The communications interface 1352 may include any combination of hardware and software suitable for coupling the components of the system 1300 to a remote device (e.g., a computing device 1340 such as a remote computer or the like) in a communicating relationship through a data network 1350.

By way of example and not limitation, this may include electronics for a wired or wireless Ethernet connection operating according to the IEEE 802.11 standard (or any variation thereof), or any other short or long-range wireless networking components or the like. This may include hardware for short range data communications such as Bluetooth or an infrared transceiver, which may be used to couple into a local area network or the like that is in turn coupled to a data network such as the internet. This may also or instead include hardware/software for a WiMAX connection or a cellular network connection (using, e.g., CDMA, GSM, LTE, or any other suitable protocol or combination of protocols). Additionally, the controller 1330 may be configured to control participation by the components of the system 1300 in any network to which the communications interface 1352 is connected, such as by autonomously connecting to the data network 1352 to retrieve updates and the like.

The system 1300 may include other resources 1370. In certain implementations, the other resources 1370 may include a camera, a power source, a sensor, a database, a valve, and the like. The other resources 1370 may also or instead include input devices such as a keyboard, a touchpad, a computer mouse, a switch, a dial, a button, and the like, as well as output devices such as a display, a speaker or other audio transducer, light emitting diodes or other lighting or display components, and the like. Other resources 1370 of the system 1300 may also or instead include a variety of cable connections and/or hardware adapters for connecting to, e.g., external computers, external hardware, external instrumentation or data acquisition systems, and the like.

FIG. 13 provides a control system that adjusts the fluid or couplant trajectory discharged from the nozzles. The trajectory can be increased or decreased depending on the control of fluid from the fluid chambers. For example, by turning selected nozzles off, the fluid pressure to other nozzles, that are on, increases. The increased pressure causes the operating nozzles to have an increased trajectory, based at least in part on the pressure.

The control of the nozzles is either pre-programmed, or determined by an operator of the inspection system, as described herein. When pre-programmed, the control is implemented by a processor executing commands and controlling the components of the inspection system based on those commands. The control of inspection system 1300 determines water, or fluid, or couplant flow to nozzles in the pre-wet ring 1302, as well as other nozzles in the system, operational status of vacuums, transducer scanning patterns and rates and speeds as well as other parameters of the inspection system 1300. The commands also include control of valves and/or sensors to control operation of the nozzles (120, 150, 151).

Figure 14:
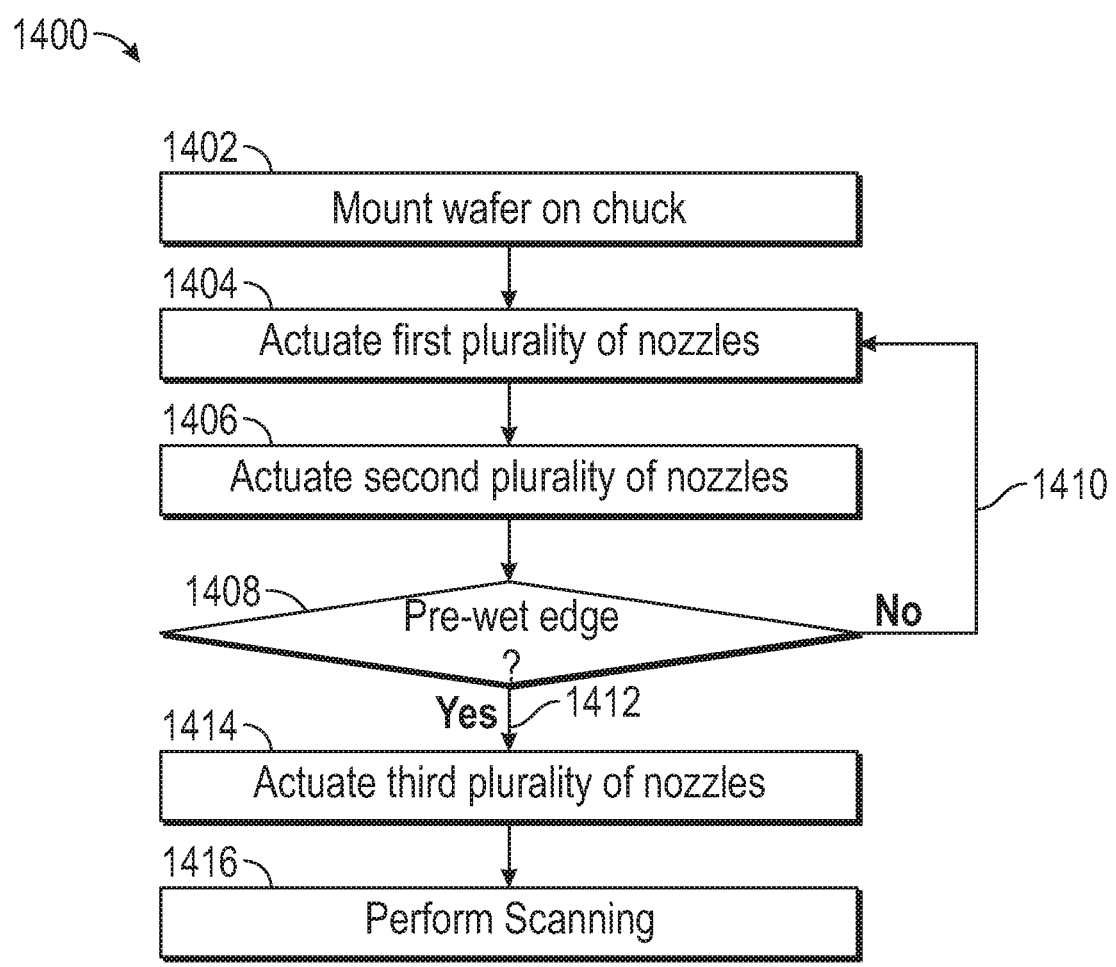
FIG. 14 illustrates a method for pre-wetting a region of an object according to an embodiment of the disclosure.

FIG. 14 shows a method 1400 for pre-wetting a region of an object according to an embodiment of the disclosure. A bonded wafer is mounted on a chuck (1402). The bonded wafer mounted on the chuck may be positioned so that the frame, pre-wet frame, or ring, as described herein has first and second nozzles pointed at a mid-section of the wafer. This is achieved by positioning the nozzles in the interior of the frame or on an exterior surface of the frame. The location of the nozzles in or on the frame is based, at least in part, on the desired area that is exposed to the fluid, couplant, or water.

A first plurality of nozzles is actuated (1404). The first nozzles, as stated above, are located to be directed to the mid-section of the wafer. The fluid trajectory is calculated so that the fluid from the first nozzles is directed at the mid-section of the bonded wafer and is not directed at the horizontal surface of the wafer mounted on the chuck.

A second plurality of nozzles is actuated (1406). The second nozzles, as stated above, are located so as to also be directed to the mid-section of the wafer. The fluid trajectory of these second nozzles is calculated so that the fluid from the second nozzles is directed at the mid-section of the bonded wafer and is not directed at the horizontal surface of the wafer mounted on the chuck.

Interactions between the fluid discharged from the first nozzles and the fluid discharged from the second nozzles dampens, or alters the individual trajectories and produces a resultant trajectory that is directed to the mid-section of the wafer. This resultant trajectory, or resultant vector, based, at least in part, on the fluid vectors of the first and second nozzles is calculated so that fluid sprayed on the horizontal surface of the bonded wafer is minimized.

A determination is made whether the edges are adequately pre-wet, or pre-soaked by the resultant vector (1408).

This determination may be based, at least in part, on the duration of soaking, the volume of fluid used or a combination of duration and volume. This threshold may be determined by using a sensor positioned to accumulate time and/or fluid volume of the nozzles.

If not (1410) the first plurality of nozzles and second plurality of nozzles continue to provide fluid to the mid-section of the bonded wafer.

If the edges of the bonded wafer are sufficiently pre-wet (1412) a third plurality of nozzles are actuated (1414).

The third plurality of nozzles are directed to the horizontal surface of the bonded wafer. These nozzles are activated after the first and second nozzles have been activated. The first and second nozzles may continue to operate when the third plurality of nozzles are activated.

Once the bonded wafer is adequately exposed to couplant, the scanning is performed (1416).

The scanning process may utilize one or more transducers to perform ultrasonic inspection of a bonded wafer. By pre-soaking, or pre-wetting the edge surface of the bonded wafer, a more uniform inspection with fewer artifacts, or perturbations results.

Figure 15:
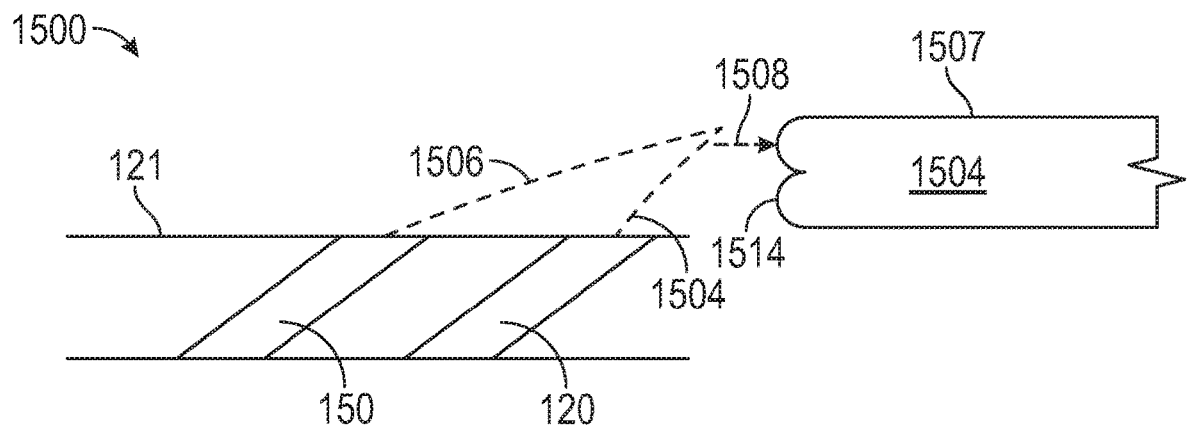
FIG. 15 shows an example of nozzles providing fluid to an edge of an object according to an embodiment described herein.

FIG. 15 shows an example 1500 of nozzles providing fluid to an object according to an embodiment described herein. Structure 121 is a portion of a frame (as described herein as frame 102) that supports nozzles 120, 150 with fluid discharges 1504 and 1506, respectively. Object 1504, which may be a wafer, has edge surface 1514 and horizontal surface 1507.

Nozzles 120 and 150 are shown in frame portion 121. Nozzle 120 discharges couplant as trajectory 1504. Nozzle 150 discharges couplant as trajectory 1506. An object, such as a wafer, 1504 has an edge surface 1514 and a horizontal surface 1507.

Trajectories 1506 and 1504 interact to produce trajectory 1508. Trajectory 1508 contacts edge portion 1514 of object 1504. The trajectory 1508 results from discharge 1504 from nozzle 120 being impacted by trajectory 1506 discharged from nozzle 150.

Figure 16A:
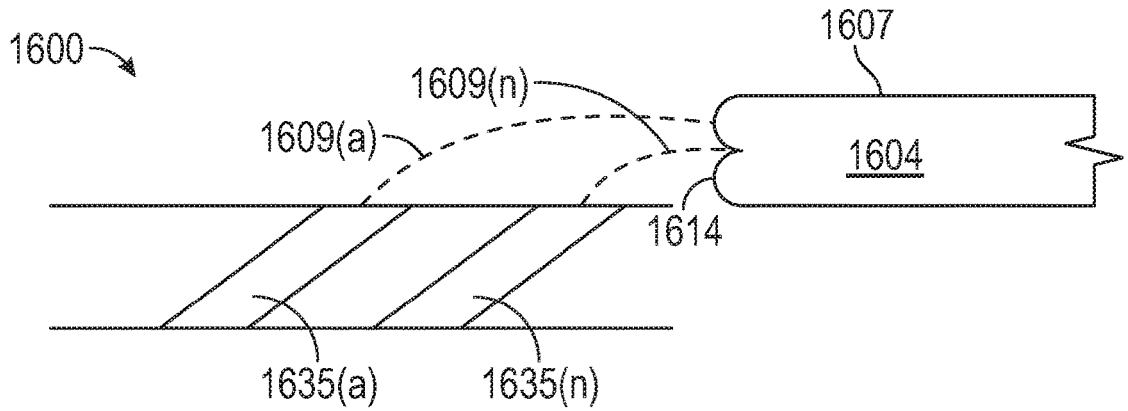
FIGS. 16A and 16B show an example of a single set of nozzles according to an embodiment of this disclosure.
Figure 16B:
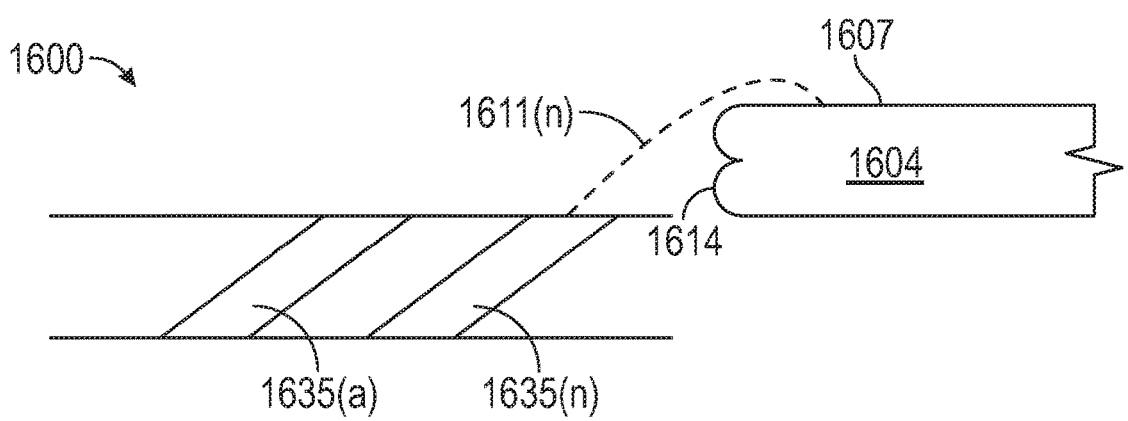

FIGS. 16A and 16B show an example 1600 of a single set of nozzles on a single frame according to an embodiment of this disclosure. This embodiment shows that a single frame supports or houses a single type of nozzle 1635(*a*) . . . (*n*) where "n" is any suitable number. This disclosure describes multiple frames, each having associated nozzle types. The frame with a single type of nozzle may be one of a plurality of frames, each having an associated type of nozzle.

The embodiments described in relation to FIGS. 16A and 16B are different than the embodiment shown in FIG. 9 in that FIGS. 16A and 16B show that a frame may have only a single type of nozzle and another frame, having a different type of nozzle may be used together. Indeed, any suitable number of frames may be used to achieve deposition of a fluid on an object, or wafer.

This embodiment includes actuating a first plurality of nozzles 1635(*a*) . . . (*n*) to spray fluid as a first fluid vector 1609(*a*) . . . (*n*) having a desired trajectory and velocity.

FIG. 16A shows an example of a plurality of one set of nozzles 1635(*a*) . . . (*n*) where "n" is any suitable number. Each nozzle 1635 has an associated discharge trajectory 1609(a) ... (n). The nozzles 1635 provide couplant to edge surface 1614 of object 1604. Horizontal surface 1607 is also shown. As shown in FIG. 16A, nozzles 1635 direct substantially all discharged couplant to edge surface 1614. Some splash couplant may reach the horizontal surface, but only as a side effect of the discharge to edge surface 1614.

FIG. 16B shows another example 1600 of a plurality of one set of nozzles 1635(a) ... (n) where "n" is any suitable number. Nozzle 1635(n) has an associated discharge trajectory 1611(n). Nozzle 1635(a) has been turned off so there is reduced or limited fluid, or couplant, discharge from nozzle 1635(a). Due to some of the nozzles, e.g., 1635(a) being turned off additional pressure is applied to nozzle 1635(n) so that trajectory 1611(n) reaches horizontal surface 1607.

Utilizing the control components shown in FIG. 13, including the one or more vacuums 1360 (e.g., a first vacuum 1364 and a second vacuum 1366), the water separator 1368, the positioning robot 1320, the controller 1330, the computing device 1340, and data network 1350) the fluid, or couplant can be adjusted to the nozzles 1635 and some of the plurality of nozzles 1635 are turned off. This control of the nozzles 1635 causes selected ones of the nozzles 1635 to have a more forceful fluid, or couplant, trajectory 1611(n). Thus, the nozzles 1635 may be used to pre-soak the edge 1614 of wafer 1604 as well as scan-soak the horizontal surface 1607 of wafer 1604.

Figure 17:
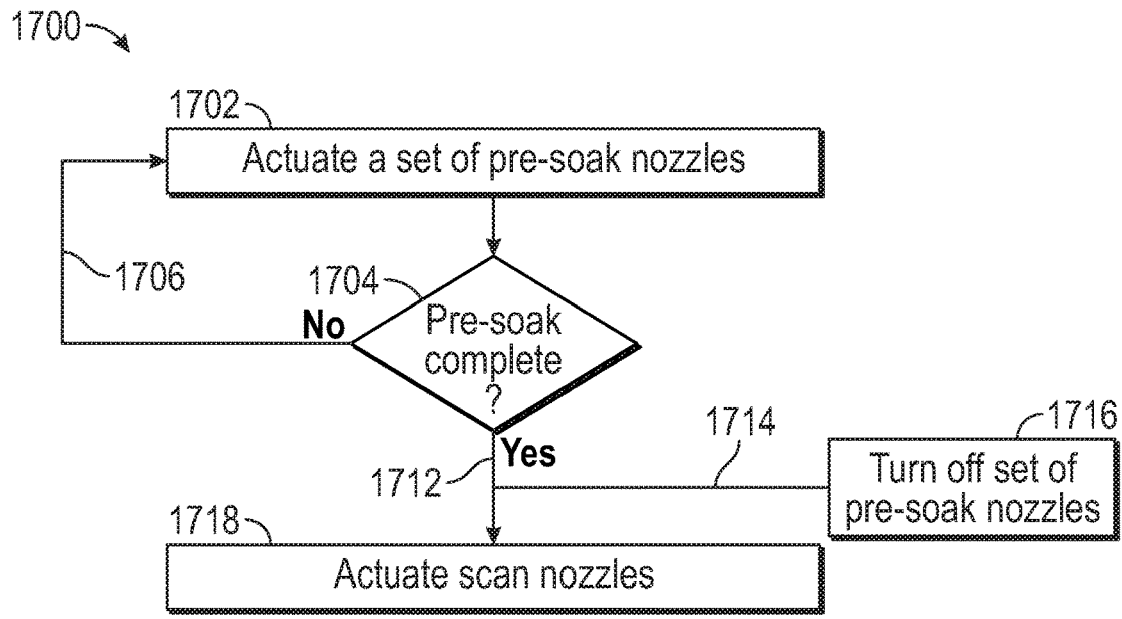
FIG. 17 shows a process to pre-soak a portion of an object according to embodiments of this disclosure.

FIG. 17 shows a process 1700 to pre-soak a portion of an object according to embodiments of this disclosure. A set of pre-soak nozzles are actuated, or turned "on", (1702). A determination is made, based of fluid volume and elapsed time, or fluid volume alone, or elapsed time alone, whether the pre-soak is complete (1704). If not, the pre-soak nozzles continue to discharge couplant to the pre-soak region of the object, such as a wafer (1706).

When pre-soak is complete (1712), the pre-soak nozzles can optionally (1714) be turned off (1716) or left on while the scan nozzles are actuated to perform a scan soak (1718).

Thus, the pre-soak is complete prior to the scan-soak being initiated.

Figure 18:
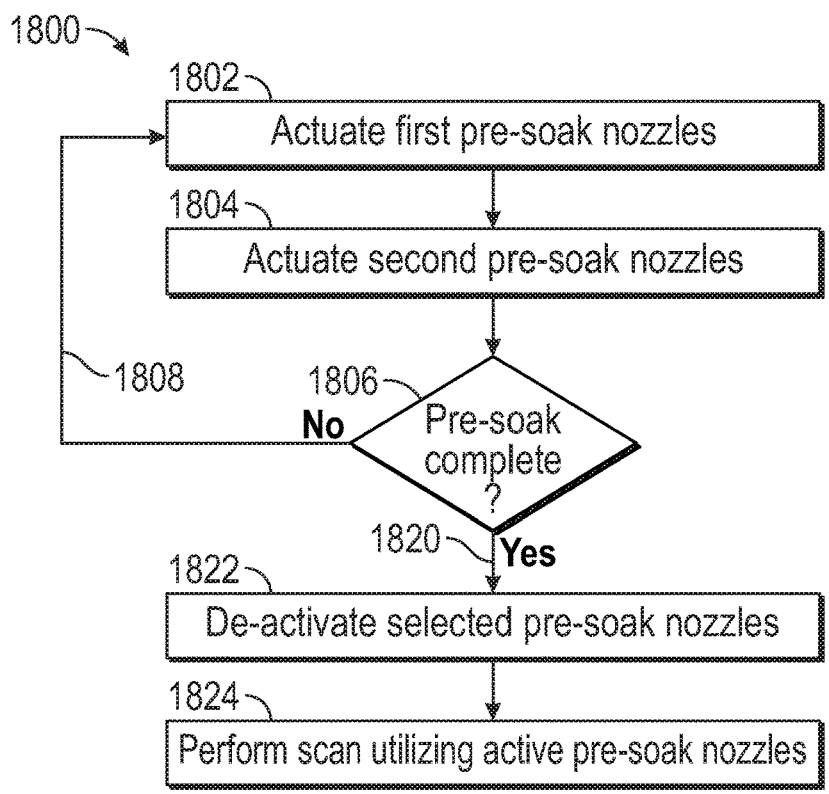
FIG. 18 shows a process to activate and de-activate selected nozzles according to embodiments described in this disclosure.

FIG. 18 shows a process 1800 to activate and de-activate selected nozzles according to embodiments described in this disclosure. This embodiment 1800 utilizes a set of pre-soak nozzles to perform the pre-soak and then a subset of the pre-soak nozzles perform the scan-soak.

A first set of pre-soak nozzles are actuated, or turned "on", (1802) and a second set of pre-soak nozzles are actuated, or turned "on", (1804). As described herein the second set of pre-soak nozzles change the trajectory of fluid discharged from the first set of pre-soak nozzles so the resultant trajectory impacts an edge portion of the wafer.

A determination is made, based on fluid volume and elapsed time, or fluid volume alone, or elapsed time alone, whether the pre-soak is complete (1806). If not, the first and second set of pre-soak nozzles continue to discharge couplant to the pre-soak region of the object, such as a wafer (1808).

When pre-soak is complete (1820), a subset of the pre-soak nozzles can be turned off, or deactivated, (1822). This subset of pre-soak nozzles that are turned off may be the second set of pre-soak nozzles or a portion of the first and second pre-soak nozzles, or the first set of pre-soak nozzles, or any combination of nozzles.

The active, or "on" nozzles are used to perform a scan soak (1824). As described herein, the fluid trajectory of the scan soak nozzles may be adjusted by increasing the pressure of the remaining operational nozzles.

Figure 19:
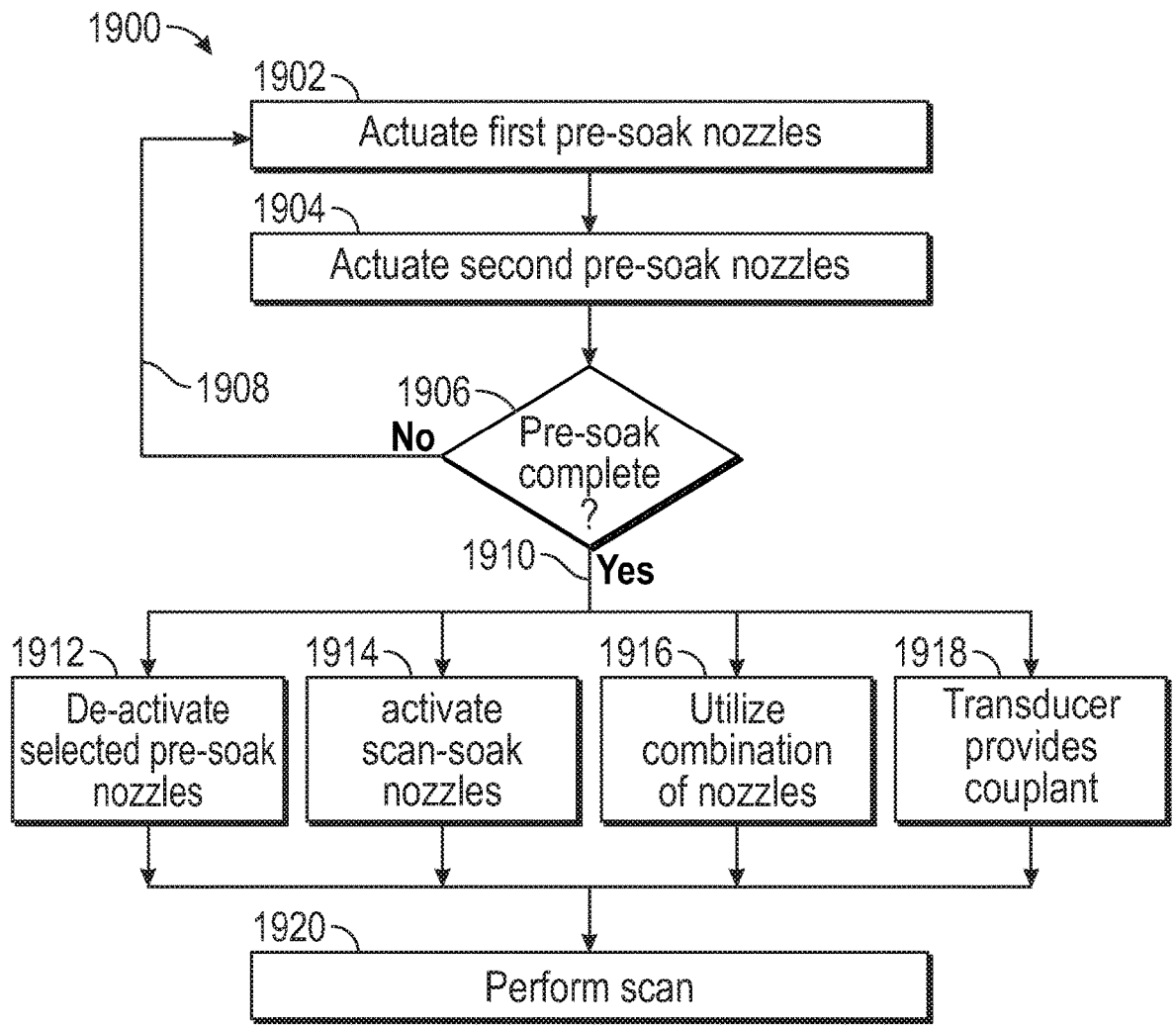
FIG. 19 shows an example of various embodiments of the disclosure.

FIG. 19 shows an example 1900 of various embodiments of the disclosure.

This embodiment 1900 illustrates various permutations of operation of nozzles to perform a pre-soak and a scan soak on an object, such as a wafer.

A first set of pre-soak nozzles are actuated, or turned "on", (1902) and a second set of pre-soak nozzles are actuated, or turned "on", (1904). As described herein the second set of pre-soak nozzles change the trajectory of fluid discharged from the first set of pre-soak nozzles so the resultant trajectory impacts an edge portion of the wafer.

A determination is made, based on fluid volume and elapsed time, or fluid volume alone, or elapsed time alone, whether the pre-soak is complete (1906). If not, the first and second set of pre-soak nozzles continue to discharge couplant to the pre-soak region of the object, such as a wafer (1908).

When pre-soak is complete (1910), a number of permutations of embodiments can occur. These embodiments may be implemented in any combination.

Selected pre-soak nozzles, which may be a subset of the pre-soak nozzles, can be turned off, or deactivated, (1912). This subset of pre-soak nozzles that are turned off, or deactivated, may be the second set of pre-soak nozzles or a portion of the first and second pre-soak nozzles, or the first set of pre-soak nozzles, or any combination of nozzles.

The active, or "on" nozzles are used to perform a scan soak (1920). As described herein, the fluid trajectory of the scan soak nozzles may be adjusted by increasing the pressure of the remaining operational nozzles.

Alternatively, one or more scan-soak nozzles are activated (1914) to perform the scan-soak (1920).

Alternatively, a combination of pre-soak nozzles and scan-soak nozzles (1916) can be used to perform the scan-soak (1920).

Alternatively, the pre-soak nozzles may be deactivated and the couplant supply at the transducer, used in the scanning can provide couplant (1918) to perform the scan (1920).

Figure 20:
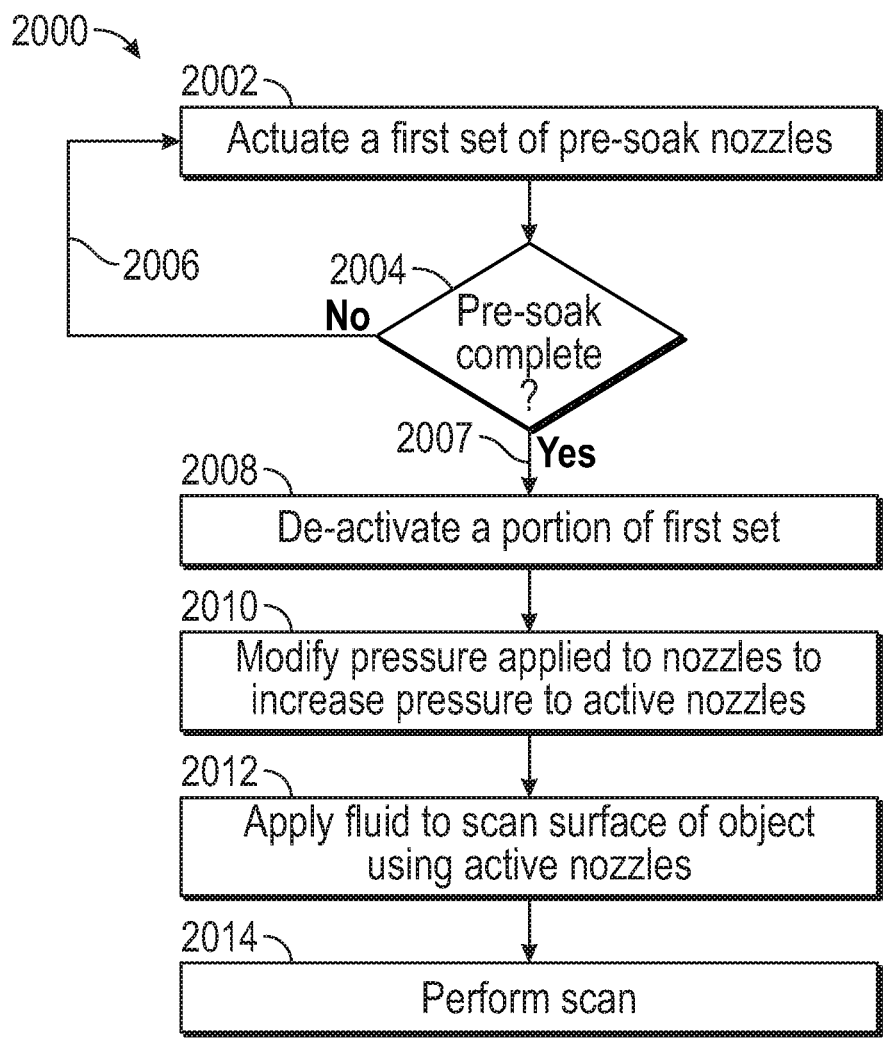
FIG. 20 shows an example of utilizing fluid pressure to change the trajectory of fluid according to an embodiment of the disclosure.

FIG. 20 shows an example 2000 of utilizing fluid pressure to change the trajectory of fluid according to an embodiment of the disclosure.

A first set of pre-soak nozzles are actuated, or turned "on", (2002).

A determination is made, based on fluid volume and elapsed time, or fluid volume alone, or elapsed time alone, whether the pre-soak is complete (2004). If not, the pre-soak nozzles continue to discharge couplant to the pre-soak region of the object, such as a wafer (2006).

When pre-soak is complete (2007), a subset of the pre-soak nozzles can be turned off, or deactivated, (2008).

The pressure to the remaining operational nozzles is adjusted, typically increased since there are fewer operating nozzles, so that the trajectory of fluid discharged from the operational nozzles is adjusted, based at least in part on the change in pressure (2010).

The active, or "on" nozzles are used to apply fluid to a scan surface of the object (2012) and the scan soak is performed (2014). As described herein, the fluid trajectory of the nozzles may be adjusted by increasing the pressure of the remaining operational nozzles.

As described above, there are various embodiments that will be described herein in a non-limiting fashion.

One embodiment is directed to an apparatus ("the apparatus") comprising: a frame; a first plurality of nozzles disposed on the frame. The first plurality of nozzles having an associated orifice with a first angle of trajectory; and a second plurality of side nozzles disposed on the frame, the second plurality of nozzles having an associated orifice with a second angle of trajectory. The first angle of trajectory generating a first trajectory of fluid and the second angle of trajectory generating a second trajectory of fluid, the first trajectory of fluid interfacing with the second trajectory of fluid.

Another embodiment is directed to the apparatus further including a fixture configured to support an object relative to the frame where the first trajectory of fluid and the second trajectory of fluid reach an edge portion of the object.

Yet another embodiment is directed to the apparatus and also comprising a plurality of center nozzles disposed on a third region of the frame.

Yet another embodiment is directed to the apparatus with a fixture configured to support an object relative to the frame where the fluid from the first plurality of nozzles and the fluid from the second plurality of nozzles reach an edge portion of the object prior to fluid from the center nozzles reaching a horizontal portion of the object.

Yet another embodiment is directed to the apparatus where the first plurality of nozzles and the second plurality of nozzles have a conical shape.

Yet another embodiment is directed to the apparatus further comprising: control circuitry operatively coupled to one or more of the first plurality of nozzles and the second plurality of nozzles to control operation of one or more of the first plurality of nozzles and the second plurality of nozzles.

Yet another embodiment is directed to the apparatus where the first trajectory of fluid and the second trajectory of fluid have a constant flow rate.

Yet another embodiment is directed to the apparatus, where the fluid is water.

Another embodiment is a method comprising: actuating a first plurality of nozzles to spray fluid as a first fluid vector having a desired trajectory and velocity; actuating a second plurality of nozzles to spray fluid as a second fluid vector having a desired trajectory and velocity; producing a resultant fluid vector based, at least in part, on the first fluid vector and the second fluid vector; and utilizing the resultant fluid vector to pre-wet an edge surface of a bonded wafer.

Another embodiment is the method described above and includes actuating a third plurality of nozzles to spray fluid as a third fluid vector, the third fluid vector used to wet a horizontal surface of the bonded wafer.

Yet another embodiment is an apparatus comprising: a frame; and a plurality of nozzles disposed on the frame, the plurality of nozzles having an associated orifice with an associated angle of trajectory of fluid deposition; the trajectory of fluid deposition based, at least in part, on an associated fluid pressure of one or more of the plurality of nozzles.

Yet another embodiment is directed the apparatus described in the preceding paragraph further comprising: a second frame; and a second plurality of nozzles disposed on the second frame, the second plurality of nozzles having an associated orifice with an associated angle of a second trajectory of fluid deposition, the second trajectory of fluid deposition based, at least in part, on an associated fluid pressure of one or more of the second plurality of nozzles.

Yet another embodiment is directed the apparatus described in the preceding paragraph further comprising a third frame; and a third plurality of nozzles disposed on the third frame, the third plurality of nozzles having an associated orifice with an associated angle of a third trajectory of fluid deposition, the third trajectory of fluid deposition based, at least in part, on an associated fluid pressure of one or more of the third plurality of nozzles.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

In general, the devices, systems, and methods described herein may be configured for, and may include, a wafer chuck to support a wafer, e.g., for inspection with a scanning acoustic microscope or the like.

A "wafer" as described herein may include a bonded wafer pair as known in the semiconductor industry, e.g., for use in one or more of microelectromechanical systems (MEMS), nanoelectromechanical systems (NEMS), microelectronics and optoelectronics, complementary metal-oxide-semiconductor (CMOS) systems, and the like.

A wafer, as used throughout this disclosure, may thus include one or more relatively thin slices of semiconductor material, such as a crystalline silicon, e.g., for use in electronics for the fabrication of integrated circuits, in photovoltaics for wafer-based solar cells, among other uses. The wafer may serve as the substrate for microelectronic devices built in and over the wafer, where the wafer may undergo a plurality of microfabrication processing steps such as doping or ion implantation, etching, deposition of various materials, photolithographic patterning, and the like.

As discussed herein, the wafer may be bonded to provide a relatively mechanically stable and hermetically sealed encapsulation of microelectronics—as such, the wafer as described herein and used throughout this disclosure may include a bonded wafer pair, which may be formed by any technique in the art such as direct bonding, surface activated bonding, plasma activated bonding, anodic bonding, eutectic bonding, glass frit bonding, adhesive bonding, thermocompression bonding, reactive bonding, transient liquid phase diffusion bonding, and so forth.

The invention claimed is:

1. An apparatus comprising:
    a frame;
    a first plurality of nozzles disposed on a first region of the frame, the first plurality of nozzles having an associated orifice with a first angle of trajectory;
    a second plurality of nozzles disposed on a second region of the frame, the second plurality of nozzles having an associated orifice with a second angle of trajectory;
    a plurality of center nozzles disposed on a third region of the frame; and
    a fixture configured to support an object relative to the frame wherein fluid from the first plurality of nozzles and fluid from the second plurality of nozzles reach an edge portion of the object prior to fluid from the plurality of center nozzles reaching a horizontal portion of the object,
    the first angle of trajectory generating a first trajectory of fluid and the second angle of trajectory generating a second trajectory of fluid, the first trajectory of fluid interfacing with the second trajectory of fluid.

2. The apparatus of claim 1, wherein the first plurality of nozzles and the second plurality of nozzles have a conical shape.

3. The apparatus of claim 1, further comprising:
    control circuitry operatively coupled to one or more of the first plurality of nozzles and the second plurality of nozzles to control operation of one or more of the first plurality of nozzles and the second plurality of nozzles.

4. The apparatus of claim 1, wherein the first trajectory of fluid and the second trajectory of fluid have a constant flow rate.

5. The apparatus of claim 1, wherein the fluid is water.

6. The apparatus of claim 1, wherein the first plurality of nozzles each have a distal portion with a first angle of between 50 and 64 degrees.

7. The apparatus of claim 1, wherein the second plurality of nozzles each have a distal portion with a first angle between 57 and 70 degrees.

8. An apparatus comprising:
    a frame:
    a plurality of side nozzles disposed on first and second regions of the frame;
    a plurality of center nozzles disposed on a third region of the frame; and
    a fixture configured to support an object relative to the frame,
    wherein fluid dispensed from the plurality of side nozzles reaches an edge portion of the object prior to fluid dispensed from the plurality of center nozzles reaching a horizontal portion of the object, and
    wherein the fixture includes a wafer chuck configured to support a wafer relative to the frame such that fluid from the plurality of size nozzles reaches an edge portion of the wafer prior to fluid from the plurality of center nozzles reaching a horizontal portion of the wafer.

9. The apparatus of claim 1, wherein: the fixture includes a wafer chuck configured to support a wafer relative to the frame; and the first trajectory of fluid and the second trajectory of fluid reach an edge portion of the wafer.

10. The apparatus of claim 8, further comprising: control circuitry operatively coupled to the plurality of side nozzles and the plurality of center nozzles to control operation of plurality of side nozzles and the plurality of center nozzles.

* * * * *